(12) United States Patent
Yano et al.

(10) Patent No.: US 8,858,844 B2
(45) Date of Patent: *Oct. 14, 2014

(54) IN—GA—ZN—O TYPE SPUTTERING TARGET

(75) Inventors: Koki Yano, Sodegaura (JP); Masayuki Itose, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 238 days.

This patent is subject to a terminal disclaimer.

(21) Appl. No.: 13/265,039

(22) PCT Filed: Nov. 16, 2010

(86) PCT No.: PCT/JP2010/006714
§ 371 (c)(1),
(2), (4) Date: Oct. 18, 2011

(87) PCT Pub. No.: WO2011/061923
PCT Pub. Date: May 26, 2011

(65) Prior Publication Data
US 2012/0118726 A1 May 17, 2012

(30) Foreign Application Priority Data
Nov. 18, 2009 (JP) .................. 2009-262800

(51) Int. Cl.
H01B 1/02 (2006.01)
C04B 35/453 (2006.01)
(Continued)

(52) U.S. Cl.
CPC .......... *C23C 14/08* (2013.01); *H01L 21/02554* (2013.01); *C04B 2235/6567* (2013.01); *C04B 2235/3293* (2013.01); *H01L 21/02488* (2013.01); *C04B 2235/80* (2013.01); *H01L 21/02631* (2013.01); *C04B 2235/6562* (2013.01); *H01L 21/02381* (2013.01); *C04B 2235/5409* (2013.01); *C04B 2235/3286* (2013.01); *C04B 2235/604* (2013.01); *C04B 2235/656* (2013.01); *C04B 2235/3284* (2013.01); *C04B 35/453* (2013.01); *H01L 21/02565* (2013.01); *H01L 29/7869* (2013.01); *C23C 14/3414* (2013.01); *C04B 2235/963* (2013.01); *C04B 2235/6565* (2013.01); *C04B 35/6261* (2013.01); *C04B 2235/664* (2013.01); *C04B 35/01* (2013.01); *C04B 35/62695* (2013.01); *C04B 2235/6585* (2013.01)
USPC .................. 252/519.5; 252/518.1; 252/520.1; 204/192.25; 204/298.13

(58) Field of Classification Search
USPC ............ 252/518.1, 520.1, 519.5; 204/192.25, 204/298.13
See application file for complete search history.

(56) References Cited

U.S. PATENT DOCUMENTS 8,153,031 B2 * 4/2012 Yano et al. ............... 252/518.1
2004/0180217 A1 9/2004 Inoue et al.
(Continued)

FOREIGN PATENT DOCUMENTS

JP 3644647 B2 2/2005
JP 2007-073312 A 3/2007
(Continued)

OTHER PUBLICATIONS

Japanese Office Action for corresponding Japanese Patent Application No. 2011-179135 (Mar. 25, 2013).
(Continued)

*Primary Examiner* — Khanh Tuan Nguyen
(74) *Attorney, Agent, or Firm* — Millen, White, Zelano & Branigan, P.C.

(57) ABSTRACT

A sputtering target including an oxide sintered body which includes In, Ga and Zn and includes a structure having a larger In content than that in surrounding structures and a structure having larger Ga and Zn contents than those in surrounding structures.

20 Claims, 13 Drawing Sheets

(51) Int. Cl.
*H01L 29/786* (2006.01)
*C23C 14/34* (2006.01)
*C04B 35/626* (2006.01)
*C23C 14/08* (2006.01)
*C04B 35/01* (2006.01)
*H01L 21/02* (2006.01)

(56) References Cited

U.S. PATENT DOCUMENTS

| | | |
|---|---|---|
| 2004/0222089 A1 | 11/2004 | Inoue et al. |
| 2008/0308774 A1 | 12/2008 | Inoue et al. |
| 2009/0325341 A1 | 12/2009 | Itagaki et al. |
| 2010/0108502 A1 | 5/2010 | Inoue et al. |
| 2010/0289020 A1 | 11/2010 | Yano et al. |
| 2011/0168994 A1 | 7/2011 | Kawashima et al. |
| 2011/0240935 A1 | 10/2011 | Yano et al. |
| 2011/0260118 A1 | 10/2011 | Yano et al. |
| 2012/0118726 A1 | 5/2012 | Yano et al. |

FOREIGN PATENT DOCUMENTS

| | | | | |
|---|---|---|---|---|
| JP | 2007-223849 A | 9/2007 | | |
| JP | 2008-53356 A | 3/2008 | | |
| JP | 2008-163442 A | 7/2008 | | |
| JP | 2008-280216 A | 11/2008 | | |
| JP | 2008-285760 A | 11/2008 | | |
| JP | 2010-047829 | * 3/2010 | ............. | C23C 14/34 |
| JP | 2010-047829 A | 3/2010 | | |
| JP | 4875135 B2 | 12/2011 | | |
| WO | 2008/072486 A1 | 6/2008 | | |
| WO | WO 2008-139654 A1 | * 11/2008 | ............. | C04B 35/00 |
| WO | 2009/075281 A1 | 6/2009 | | |
| WO | 2009/148154 A1 | 12/2009 | | |
| WO | 2010/070832 A1 | 6/2010 | | |

OTHER PUBLICATIONS

Partial Translation of Japanese Office Action for corresponding Japanese Patent Application No. 2011-179135.

International Search Report, dated Dec. 21, 2010, issued in corresponding PCT/JP2010/006714.

Written opinion, dated Dec. 21, 2010, issued in corresponding PCT/JP2010/006714.

Moriga, T., et al., "Electrical and Optical Properties of Transparent Conducting Homologous Compounds in the Indium—Gallium—Zinc Oxide System," Journal of American Ceramic Society (1999) vol. 82(10), pp. 2705-2710.

Office Action, issued on Oct. 4, 2011, in the corresponding Korean patent application No. 10-2011-7019081.

* cited by examiner

IN—GA—ZN—O TYPE SPUTTERING TARGET

TECHNICAL FIELD

The invention relates to a sputtering target for forming an oxide thin film such as an oxide semiconductor and a transparent conductive film, in particular, a sputtering target for forming a thin film transistor.

BACKGROUND ART

An amorphous oxide film composed of indium oxide, zinc oxide and gallium oxide has attracted attention as a transparent conductive film or a semiconductor film (used in a thin film transistor or the like) since it has transmittance to visible rays and a wide range of electric properties from a semiconductor to an insulator.

The oxide film is formed by a physical film-forming method such as sputtering, pulse laser deposition (PLD) and deposition or a chemical film forming method such as a sol-gel method. A physical film-forming method such as sputtering has been mainly studied since a film is uniformly formed in a large area at a relatively low temperature.

When forming an oxide thin film by a physical film-forming method such as sputtering, it is common to use a target formed of an oxide sintered body in order to form a uniform film stably and efficiently (at a high film-forming speed).

As the representative oxide films (conductive film/semiconductor film), an oxide film composed of indium oxide, zinc oxide and gallium oxide can be given, for examples. As the target (mainly, a sputtering target) for forming these oxide films (normally, amorphous films), studies have been made mainly on a crystal form with a homologous structure such as $InGaZnO_4$ and $In_2Ga_2ZnO_7$.

For example, Patent Documents 1 to 4 each disclose a target having a homologous structure represented by $InGaZnO_4(InGaO_3(ZnO))$. However, since the homologous structure hardly causes oxygen deficiency, it was necessary to allow oxygen deficiency to cause to reduce the resistance by conducting a reduction treatment at a high temperature (Patent Document 1). Therefore, a production method which does not generate a highly insulative $Ga_2O_3$ crystal phase (Patent Document 3), a method in which a positive tetravalent metal is added or the like (Patent Document 4) and a target formed of a mixture of a hexagonal compound represented by $InGaZnO_4$ and a compound with a spinel structure represented by $ZnGa_2O_4$ (Patent Document 4) have been studied. However, they have problems that the advantageous effects are limited and management is difficult due to an increased number of constituting elements.

Studies have been made on the production of various thin film transistors by changing the composition ratio of indium oxide, zinc oxide and gallium oxide (Patent Document 5). However, since the studies on the target at each composition were not sufficiently made, the specific resistance of these thin film transistors was still high. In addition, an example was disclosed in which an amorphous oxide semiconductor film and a thin film transistor were formed by using an In—Ga—Zn—O sintered body with a metal composition ratio In:Ga:Zn=30:15:55 (Patent Document 6). However, there was a problem that the Ga content of a thin film was significantly decreased such that it became about two-third of the Ga content of the target. This suggests improper properties of the target, however, no studies were made on the target properties and the improvement thereof.

RELATED ART DOCUMENTS

Patent Documents

Patent Document 1: Japanese Patent No. 3644647
Patent Document 2: JP-A-2007-73312
Patent Document 3: JP-A-2007-223849
Patent Document 4: WO2008/072486
Patent Document 5: WO2009/075281
Patent Document 6: JP-A-2008-53356

SUMMARY OF THE INVENTION

An object of the invention is to provide a target for forming an oxide semiconductor film which can have a low specific resistance without conducting a reduction treatment.

In order to attain the above-mentioned object, the inventors made intensive studies, and have found that, if an oxide target containing In, Ga and Zn comprises a structure of which the In content is larger than that of surrounding structures (hereinafter referred to as an "In-rich structure), a target with a low specific resistance can be obtained without conducting a reduction treatment, in particular, a reduction treatment at a high temperature. The reason therefor is assumed that due to the inclusion of an In-rich structure, oxygen deficiency can be generated easily. Further, the inventors have found that an In-rich structure can be generated in an oxide sintered body containing In, Ga and Zn by selecting the composition ratio (atomic ratio) of elements and production conditions. In addition, the inventors have found that, since this target has a small In content, as compared with a target having a large amount of In such as ITO, a significantly small amount of nodules is formed at the time of sputtering, and hence, it is expected that defects derived from particles which are generated by abnormal discharge or the like caused by nodules when a thin film transistor is fabricated can be decreased.

Further, the inventors have found that a semiconductor device, in particular, a thin film transistor, formed by using a target composed of this oxide sintered body has excellent TFT properties, and that by using this oxide sintered body, a sputtering target suitable for forming a semiconductor device can be prepared. The invention has been made based on this finding.

According to the invention, the following sputtering target, the production method thereof and the method for producing a semiconductor device are provided.

1. A sputtering target comprising an oxide sintered body which comprises In, Ga and Zn and comprises a structure having a larger In content than that in surrounding structures and a structure having larger Ga and Zn contents than those in surrounding structures.
2. The sputtering target according to 1, wherein the oxygen content in the structure having a larger In content is smaller than that in surrounding structures.
3. The sputtering target according to 1 or 2, wherein the structure having a larger In content has a continuous structure with a length of 15 μm or longer.
4. The sputtering target according to one of 1 to 3, wherein the oxide sintered body has a bixbyite structure represented by $In_2O_3$ and a homologous structure represented by $InGaZnO_4$.
5. The sputtering target according to one of 1 to 3, wherein the oxide sintered body comprises a bixbyite structure represented by $In_2O_3$ and a spinel structure represented by $ZnGa_2O_4$.

6. The sputtering target according to one of 1 to 3, wherein the oxide sintered body comprises a bixbyite structure represented by $In_2O_3$ and a homologous structure represented by $In_{1.5}Ga_{0.5}Zn_2O_5$.

7. The sputtering target according to one of 1 to 6, wherein the atomic ratio of In, Ga and Zn of the oxide sintered body satisfies the following formulas:

$$0.20 \leq In/(In+Ga+Zn) \leq 0.70$$

$$0.01 \leq Ga/(In+Ga+Zn) \leq 0.50$$

$$0.05 \leq Zn/(In+Ga+Zn) \leq 0.60$$

8. The sputtering target according to 7, wherein the atomic ratio of In, Ga and Zn of the oxide sintered body satisfies the following formulas:

$$Ga/(In+Ga+Zn) \leq 0.45$$

$$0.10 \leq Zn/(In+Ga+Zn) \leq 0.40$$

$$In/(In+Ga) < 0.60.$$

9. The sputtering target according to 7, wherein the atomic ratio of In, Ga and Zn of the oxide sintered body satisfies the following formulas:

$$In/(In+Ga+Zn) \leq 0.65$$

$$0.10 \leq Ga/(In+Ga+Zn)$$

$$0.10 \leq Zn/(In+Ga+Zn)$$

$$0.60 \leq In/(In+Ga)$$

$$0.51 \leq In/(In+Zn).$$

10. The sputtering target according to one of 1 to 9, wherein the oxide sintered body further comprises Sn in an atomic ratio which satisfies the following formula:

$$0.0001 < Sn/(In+Ga+Zn+Sn) < 0.10$$

11. The sputtering target according to one of 1 to 9, which essentially consists of In, Ga, Zn and O.

12. A method for producing the sputtering target according to 5, which comprises the step of sintering a shaped body which comprises an oxide comprising a spinel structure represented by $ZnGa_2O_4$.

13. A method for producing a semiconductor device comprising the step of forming an oxide film by using the sputtering target according to one of 1 to 11.

According to the invention, it is possible to provide a target for forming an oxide semiconductor film which can have a low specific resistance without conducting a reduction treatment.

According to the invention, it is possible to provide a sputtering target which has excellent film-forming properties, in particular, a sputtering target for forming an oxide semiconductor film.

MODE FOR CARRYING OUT THE INVENTION

The sputtering target of the invention (hereinafter referred to as the target of the invention) contains In, Ga and Zn, and comprises a structure of which the In content is larger than that of the surrounding structures and a structure of which the Ga content and the Zn content are larger than those of the surrounding structures.

Due to the presence of the In-rich structure, the specific resistance can be reduced easily without conducting a reduction treatment.

The In-rich structure is a structure of which the In content is larger than that of the surrounding structures.

The Ga, Zn-rich structure is a structure of which both the Ga content and the Zn content are larger than those of the surrounding structures. Due to the presence of the Ga, Zn-rich structure, an increase in resistance due to the appearance of a Ga single structure can be suppressed.

Further, it can be expected that a difference between the composition ratio of the target and the composition ratio of a film formed by sputtering or occurrence of abnormal discharge due to the generation of a Ga single structure is suppressed.

Presence of the In-rich structure and the Ga, Zn-rich structure can be confirmed by the dispersion map taken by means of an electron probe microanalyzer (EPMA) of In, Ga, Zn and O.

Figure 2:
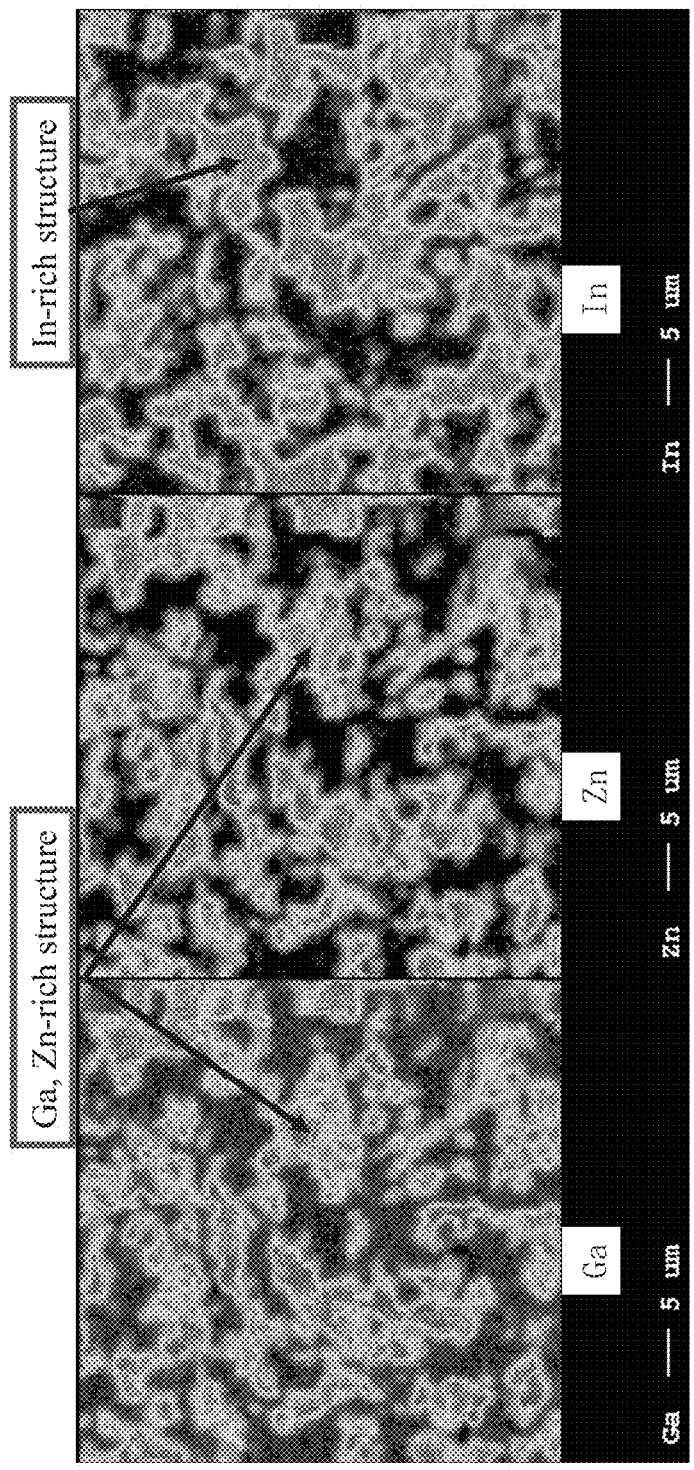
FIG. 2 is a microscopic photograph taken by an EPMA showing a dispersion map of In, Ga and Zn in the oxide prepared in Example 4.

For example, the dispersion map of In, Ga, Zn and O of the oxide sintered body obtained in Example 4, mentioned later, is shown in FIG. 2. As is apparent from FIG. 2, in the oxide sintered body constituting the target of the invention, the In-rich structure and the Ga, Zn-rich structure are in a mixed state.

Measurement by means of an EPMA can be conducted using the following apparatus under the following conditions.

Apparatus: JXA-8200, manufactured by JEOL Ltd.
Measurement Conditions:
Accelerated voltage: 15 kV
Irradiation current: 50 nA
Irradiation time (per point): 50 mS It is preferred that the oxide constituting the target of the invention have oxygen deficiency. The amount of oxygen deficiency is preferably in the range of $3 \times 10^{-5}$ to $3 \times 10^{-1}$, with $1 \times 10^{-4}$ to $1 \times 10^{-1}$ being more preferable. Within the above-mentioned range, the specific resistance may be decreased easily.

The oxygen deficiency amount is a value, expressed in terms of mole, obtained by deducing the number of oxygen ions contained in one mole of an oxide crystal from the chemical stoichiometric number of oxygen ions. The number of oxygen ions contained in an oxide crystal can be calculated by measuring by infrared absorption spectroscopy the amount of carbon dioxide which is generated by heating oxygen crystals in carbon powder, for example. Further, the stoichiometric number of oxygen ions can be calculated from the mass of the oxide crystal.

The amount of oxygen deficiency can be adjusted by the atmosphere or the like during sintering, heating and cooling. Further, it can also be adjusted by subjecting the oxide to a reduction treatment or the like after sintering. Meanwhile, due to the presence of the In-rich structure, the oxygen deficiency amount can be adjusted easily within the above-mentioned range without conducting a reduction treatment after sintering.

In the target of the invention, it is preferred that the oxygen content in the above-mentioned structure having a large In content (In-rich structure) be smaller than that in the surrounding structures.

The structure surrounding the In-rich structure means the Ga, Zn-rich structure which surrounds the In-rich structure and other structures.

Figure 3:
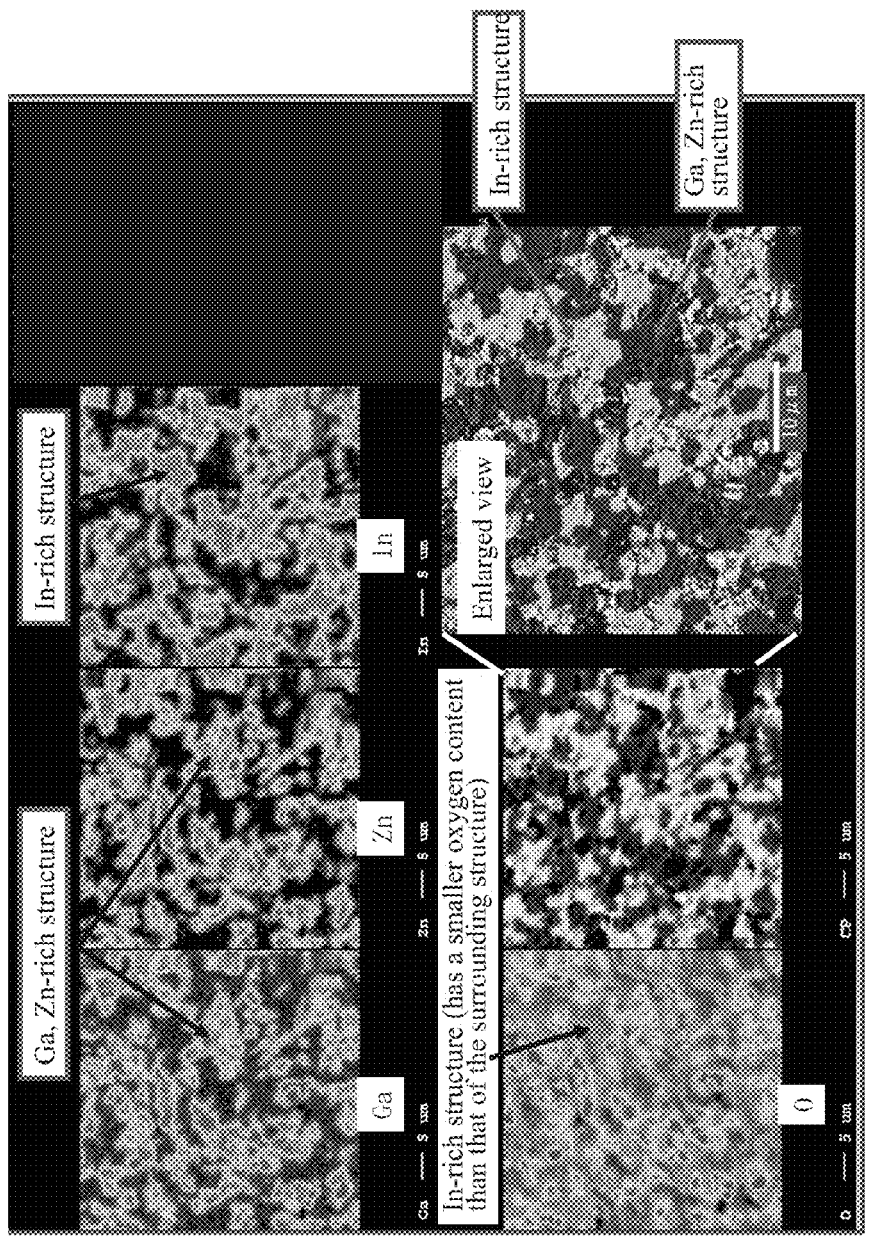
FIG. 3 is a microscopic photograph taken by an EPMA showing a dispersion map of In, Ga, Zn and O in the oxide sintered body prepared in Example 4.

The fact that the oxygen content of the In-rich structure is smaller than the oxygen content of the Ga, Zn-rich structure or other structures can be confirmed by the dispersion map measured by means of an EPMA of In, Ga, Zn and O. For example, if the structures are compared in FIG. 3 which shows dispersion map of In, Ga, Zn and O of the oxide sintered body obtained in Example 4 mentioned later, it is understood that the oxygen content of the In-rich structure is smaller than that of the surrounding structures.

In the target of the invention, it is preferred that the above-mentioned structure of which the In content is large (In-rich structure) have a continuous structure of 15 μm or more.

The fact that the In-rich structure has a continuous structure of 15 μm or more can be confirmed by the dispersion map taken by an EPMA of In, Ga, Zn and O.

Figure 4:
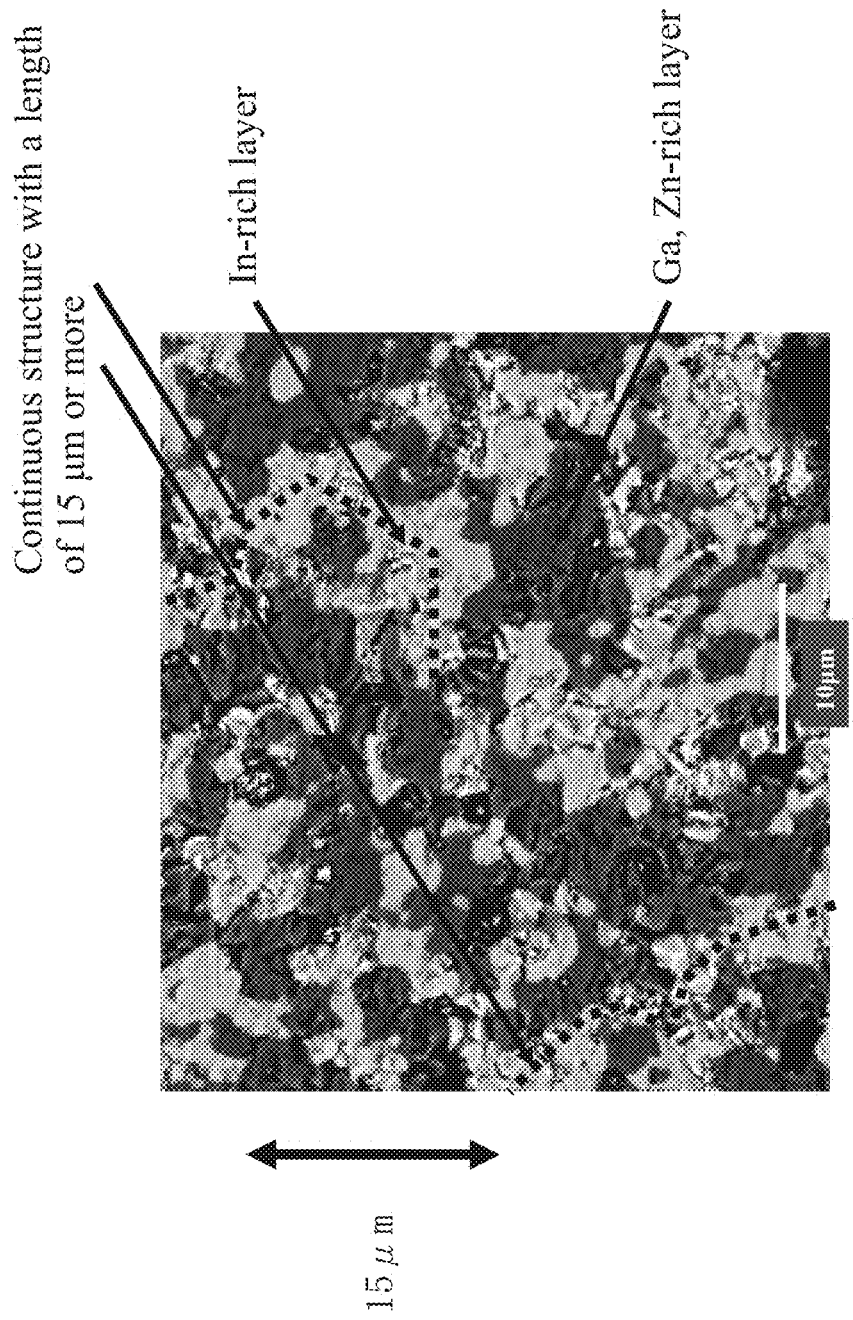
FIG. 4 is a microscopic photograph showing a continuous structure of an In-rich structure in a dispersion map of In, Ga, Zn and O in the oxide sintered body prepared in Example 4.

For example, an enlarged view of an EPMA image of the oxide sintered body obtained in Example 4, mentioned later, is shown in FIG. 4. A part indicated by a dotted line in FIG. 4 shows the continuous structure of the In-rich structure.

Since the In-rich structure has a continuous structure of 15 μm or more in length, electricity passes through the In-rich structure, whereby the specific resistance can be decreased.

It is preferred that the length of the continuous structure be 20 μm or more, with 30 μm or more being particularly preferable.

The width of the continuous structure is preferably 20 μm or less, more preferably 10 μm or more, and particularly preferably 5 μm or less.

The aspect ratio of the continuous structure with a length of 15 μm or more is preferably 1.5 or more, more preferably 2 or more, with 3 or more being particularly preferable.

The length and the width of the continuous structure respectively mean the long axis and the short axis of the ellipse which is circumscribed with the continuous structure. The aspect ratio is defined by the long axis/the short axis. It is expected that the larger the aspect ratio of the continuous structure, the lower the specific resistance.

Figure 5:
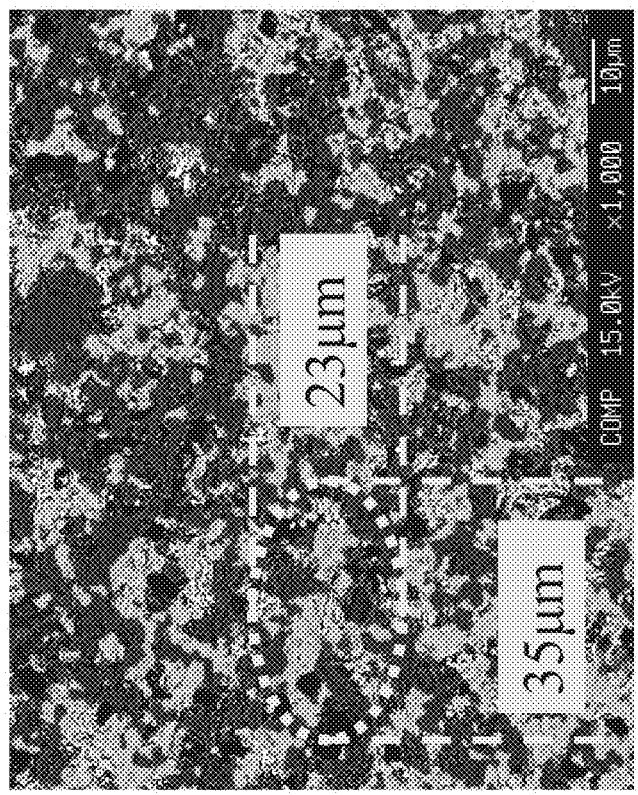
FIG. 5 is a microscopic photograph showing an example in which the aspect ratio of an In-rich structure of the oxide sintered body prepared in Example 4 is calculated.

One example of the measurement of the aspect ratio in the target obtained in Example 4, mentioned later, is shown in FIG. 5.

The length, width and aspect ratio of the continuous structure is each obtained by arbitrary selecting 20 continuous structures from a photograph taken by an EPMA, and taking the average value thereof.

In the target of the invention, it is preferred that the oxide sintered body contain a bixbyite structure represented by $In_2O_3$ and a homologous structure represented by $InGaZnO_4$.

Inclusion of the bixbyite structure represented by $In_2O_3$ and the homologous structure represented by $InGaZnO_4$ can be confirmed by an X-ray diffraction (XRD) measurement. For example, it can be measured by the following apparatus and under the following conditions.

X-ray diffraction (XRD) measurement
Apparatus: "Ultima-III" manufactured by Rigaku Corporation
X-rays: Cu-Kα radiation (wavelength: 1.5406 Å, monochromatized using a graphite monochrometor)
2θ-θ reflection method, continuous scan (1.0°/min)
Sampling interval: 0.02°
Slit DS, SS: ⅔°, RS: 0.6 mm The bixbyite structure represented by $In_2O_3$ (or the C-type crystal structure of a rare earth oxide) is a cubic crystal system having a space group represented by $(T_h^7, I_{a3})$, and is also called as $Mn_2O_3(I)$ type oxide crystal structure. $Sc_2O_3$, $Y_2O_3$, $Tl_2O_3$, $Pu_2O_3$, $Am_2O_3$, $Cm_2O_3$, $In_2O_3$ and ITO (obtained by doping $In_2O_3$ with about 10 wt % or less of Sn) show this crystal structure ("Technology of Transparent Conductive Film", edited by the 166th Committee on Photonic and Electronic Oxide Materials of the Japan Society for the Promotion of Science (Mar. 30, 1999, published by Ohmsha)). The presence of the bixbyite structure represented by $In_2O_3$ (the C-type crystal structure of a rare earth oxide) can be confirmed by the fact that it shows a pattern of No. 6-0416 of the JCPDS card in the X-ray diffraction.

The C-type crystal structure of a rare earth oxide is a structure in which one out of four negative ions are withdrawn from a fluorite crystal structure, which is represented by $MX_2$ (M: positive ion, X: negative ion), since the stoichiometric ratio is $M_2X_3$. Six negative ions (normally oxygen in the case of an oxide) are coordinated relative to positive ions, and the remaining two negative ion sites are vacant (the vacant negative ion site is called as the metastable ion site) (see the above-mentioned "Technology of Transparent Conductive Film"). The C-type crystal structure of a rare earth oxide in which 6 oxygens (negative ions) are coordinated in a positive ion has an edge-sharing oxygen octahedral structure. If a crystal structure has an edge-sharing oxygen octahedral structure, the ns orbits of a p metal, which is a positive ion, are overlapped one on another to form a transmission path of electrons, whereby the effective mass is reduced to have an increased electron mobility.

The bixbyite structure represented by $In_2O_3$ (C-type crystal structure of a rare earth oxide) may have a stoichiometric ratio deviated from $M_2X_3$ as long as it shows a pattern of No. 6-0416 of the JCPDS card in the X-ray diffraction. That is, the stoichiometric ratio may be $M_2O_{3-d}$.

When m is 1 in the crystal structure represented by $InGaO_3(ZnO)_m$ (m is an integer of 1 to 20), this becomes $InGaO_3$ (ZnO). The crystal structure represented by $InGaO_3(ZnO)_m$ (m is an integer of 1 to 20) is called as the "hexagonal compound" or the "crystal structure with a homologous phase", and this is a crystal which is formed of a "natural superlattice" structure having a long period in which crystal layers of different materials are overlapped one on another. If the crystal period or the thickness of each thin film layer is on the order of nanometer, due to combination of the chemical composition or thickness of each layer, specific properties different from a single substance or a mixed crystal obtained by mixing the layers uniformly can be obtained. The crystal structure of the homologous phase can be confirmed from the fact that an X-ray diffraction pattern measured from the powder obtained by pulverizing a target or directly measured from a target conforms to the X-ray diffraction pattern of the crystal structure of the homologous phase which can be assumed from the composition ratio, for example. Specifically, it can be confirmed from the fact that it conforms to the X-ray diffraction pattern of the crystal structure with the homologous phase obtained from the JCPDS (Joint Committee of Powder Diffraction Standards). In the case of $InGaO_3(ZnO)$, the crystal structure thereof is given in the JCPDS card No. 38-1104.

The lattice constant "a" of the bixbyite structure represented by $In_2O_3$ is preferably 10.14 or less, more preferably 10.10 or less, and particularly preferably 10.08 or less. The lattice constant "a" is obtained by fitting of XRD. If the lattice constant is small, it can be expected that the specific resistance is reduced due to improvement in mobility.

In the target of the invention, it is preferred that the oxide sintered body contain a bixbyite structure represented by $In_2O_3$ and a spinel structure represented by $ZnGa_2O_4$.

The crystal structure represented by $ZnGa_2O_4$ may have a deviated stoichiometric ratio as long as it shows a pattern of No. 38-1240 of the JCPDS card in the X-ray diffraction. That is, it may be $ZnGa_2O_{4-d}$. It is preferred that the oxygen deficiency amount d be in the range of $3\times10^{-5}$ to $3\times10^{-1}$. The value of d can be adjusted by sintering conditions or the atmosphere during sintering, heating and cooling or the like. Further, it can be adjusted by conducting a reduction treatment after sintering or the like.

In the target of the invention, it is preferred that the oxide sintered body contain a bixbyite structure represented by $In_2O_3$ and a homologous structure represented by $In_{1.5}Ga_{0.5}Zn_2O_5$.

The homologous structure represented by $In_{1.5}Ga_{0.5}Zn_2O_5$ is an In—Ga—Zn-based oxide containing an indium element (In), a gallium element (Ga) and a zinc element (Zn) and satisfies the following condition 1. Further, it is preferred that the homologous structure represented by $In_{1.5}Ga_{0.5}Zn_2O_5$ satisfy the following condition 2, with the following condition 3 being satisfied particularly preferable.

Condition 1: In a chart obtained by an X-ray diffraction measurement (CuKα rays), a diffraction peak is observed in the following regions A to E:
A: Incident angle (2θ) of 7.0° to 8.4° (preferably 7.2° to 8.2°)
B: Incident angle (2θ) of 30.6° to 32.0° (preferably 30.8° to 31.8°)
C: Incident angle (2θ) of 33.8° to 35.8° (preferably 34.3° to 35.3°)
D. Incident angle (2θ) of 53.5° to 56.5° (preferably 54.1° to 56.1°)°
E: Incident angle (2θ) of 56.5° to 59.5° (preferably 57.0° to 59.0°)
Condition 2: One of diffraction peaks observed at positions corresponding to incident angles (2θ) of 30.6° to 32.0° (the above-mentioned region B) and 33.81° to 35.8° (the above-mentioned region C) is a main peak and the other is a sub peak.

Meanwhile, the main peak is a peak of which the intensity is largest within a range of 2θ of 5° to 80° (that is, a peak of which the height is the highest) and the sub peak is a peak of which the intensity is the second largest (that is, a peak of which the height is the second highest).
Condition 3: In a chart obtained by an X-ray diffraction measurement (CuKα rays), a diffraction peak is observed in the following regions F to K:
F: Incident angle (2θ) of 14.8° to 16.2° (preferably 15.0° to 16.0°)
G: Incident angle (2θ) of 22.3° to 24.3° (preferably 22.8° to 23.8°)
H: Incident angle (2θ) of 32.2° to 34.2° (preferably 32.7° to 33.7°)
I. Incident angle (2θ) of 43.1° to 46.1° (preferably 43.6° to 45.6°)
J: Incident angle (2θ) of 46.2° to 49.2° (preferably 46.7° to 48.7°)
K: Incident angle (2θ) of 62.7° to 66.7° (preferably 63.7° to 65.7°)

Figure 6:
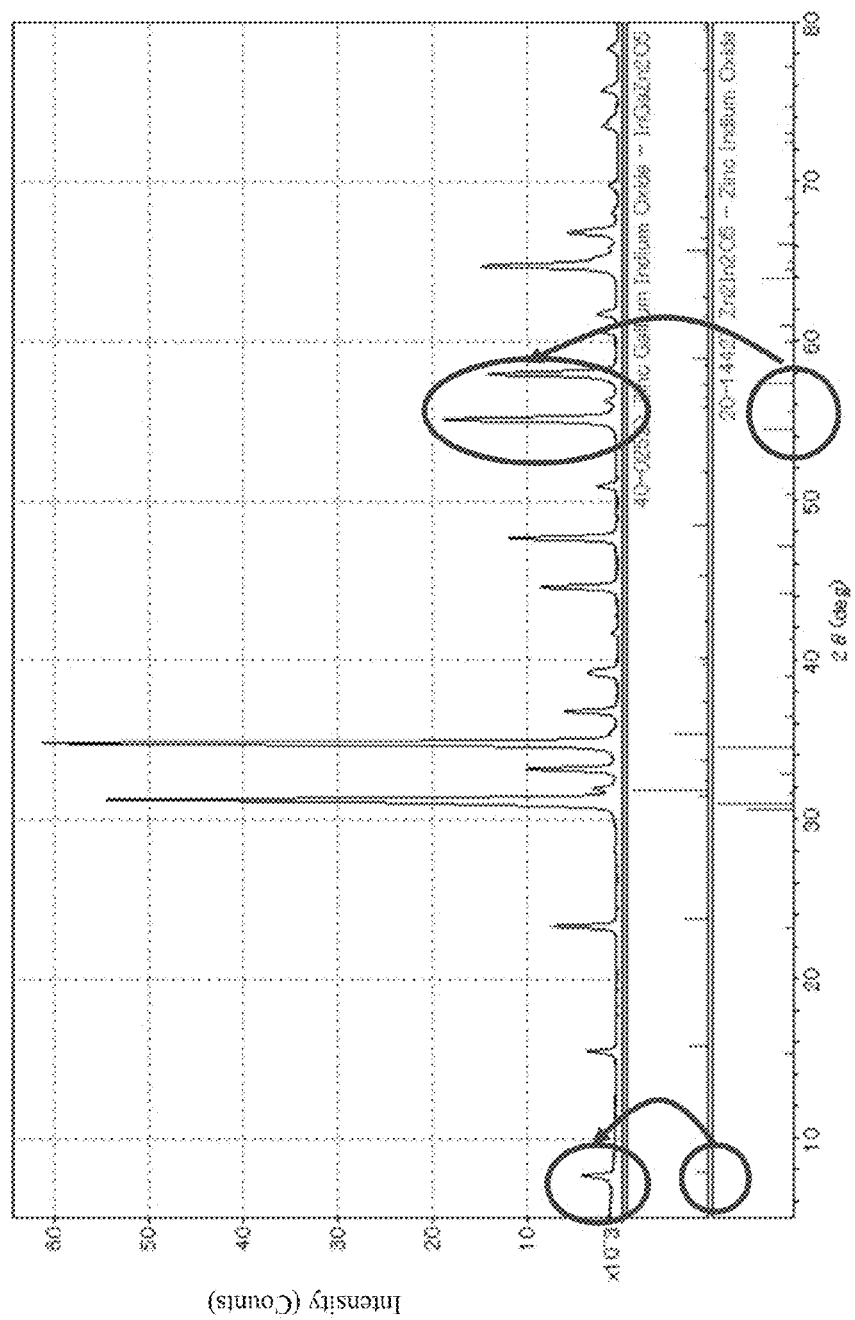
FIG. 6 is one example of a chart obtained by an X-ray diffraction measurement (CuKα rays) of a homologous structure represented by $In_{1.5}Ga_{0.5}Zn_2O_5$ obtained in the invention.

An example of a chart obtained by an X-ray diffraction measurement of the homologous structure represented by $In_{1.5}Ga_{0.5}Zn_2O_5$ is shown in FIG. 6.

The oxide crystal satisfying the above-mentioned conditions is a novel crystal which is not found in the JCPDS (Joint Committee of Powder Diffraction Standards) cards, and hence, is a novel crystal which has not been confirmed so far.

The X-ray diffraction chart of the homologous structure represented by $In_{1.5}Ga_{0.5}Zn_2O_5$ is similar to the crystal structure represented by $InGaO_3(ZnO)_2$ (JCPDS: 40-0252) and the crystal structure represented by $In_2O_3(ZnO)_2$ (JCPDS: 20-1442). However, this oxide has a peak specific to $InGaO_3(ZnO)_2$ (a peak in the above-mentioned region A), a peak specific to $In_2O_3(ZnO)_2$ (a peak in the above mentioned regions D and E) and a peak which is not observed in $InGaO_3(ZnO)_2$ and $In_2O_3(ZnO)_2$ (the above-mentioned region B). Therefore, it can be judged that the oxide has a novel periodicity which is different from that of $InGaO_3(ZnO)_2$ and that of $In_2O_3(ZnO)_2$. That is, the oxide with a homologous structure represented by $In_{1.5}Ga_{0.5}Zn_2O_5$ is different from $InGaO_3(ZnO)_2$ and $In_2O_3(ZnO)_2$.

As for the peak of the above-mentioned region B, this peak exists between the main peaks of $In_2O_3(ZnO)_2$ and $InGaO_3(ZnO)_2$ (i.e., between around 31° and around 32°). Therefore, this peak shifts to the lower angle side than the main peak of $InGaO_3(ZnO)_2$ (it appears that the lattice spacing is increased), and this peak shifts to the higher angle side than the main peak of $In_2O_3(ZnO)_2$ (it appears that the lattice spacing is decreased).

The crystal structure of the oxide of the invention appears to be similar to the crystal structure of $InGaO_3(ZnO)_2$ (JCPDS: 40-0252) and to the crystal structure of $In_2O_3(ZnO)_2$ (JCPDS: 20-1442).

Figure 7:
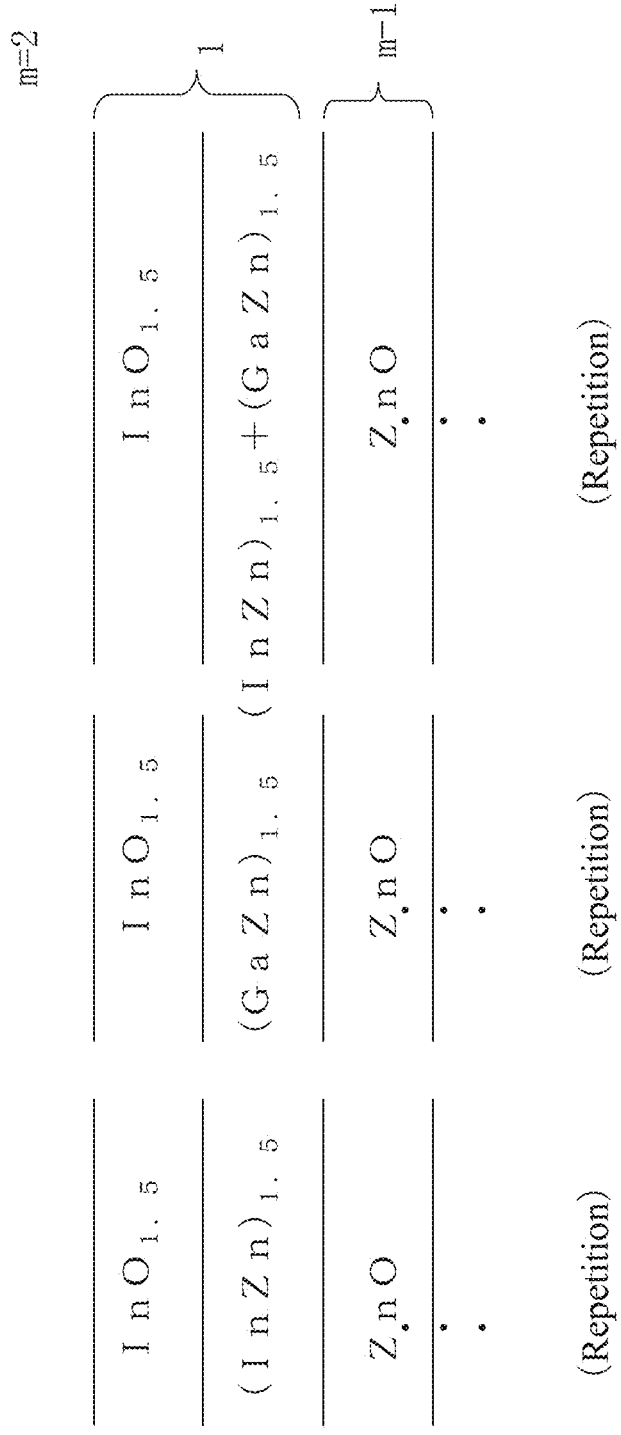
FIG. 7 is a view showing the process of assuming the structure of a novel crystal structure represented by the structural formula $In_{1.5}Ga_{0.5}Zn_2O_5$.

A process in which the structural formula $In_{1.5}Ga_{0.5}Zn_2O_5$ of the above-mentioned novel crystal structure is assumed based on the above-mentioned known crystal structure is shown in FIG. 7.

In the target of the invention, it is preferred that the atomic ratio of In, Ga and Zn of the above-mentioned oxide sintered body satisfy the following formulas:

$$0.20 \leq In/(In+Ga+Zn) \leq 0.70$$

$$0.01 \leq Ga/(In+Ga+Zn) \leq 0.50$$

$$0.05 \leq Zn/(In+Ga+Zn) \leq 0.60$$

Outside the above-mentioned range, it is difficult to allow the two layers, i.e. the In-rich structure and the Ga, Zn-rich structure, to be generated.

Further, when forming a thin film transistor, if In/(In+Ga+Zn) is less than 0.20, mobility may be lowered. If In/(In+Ga+Zn) exceeds 0.70, the thin film transistor may be in the normally-on state.

If Ga/(In+Ga+Zn) is less than 0.01, moisture resistance may be decreased or photocurrent may be increased. If Ga/(In+Ga+Zn) exceeds 0.50, mobility may be lowered.

If Zn/(In+Ga+Zn) is less than 0.05, the amount of residues may be increased during wet etching. If Zn/(In+Ga+Zn) exceeds 0.60, moisture resistance may be lowered or the etching speed may become too fast to make control difficult during wet etching.

Further, if the atomic ratio of In, Ga and Zn is within the following range, mobility is increased when a thin film transistor is fabricated. Further, it is easy to allow the In-rich structure and the Ga, Zn-rich structure to be generated in the resulting oxide sintered body.

$0.51 \leq \text{In}/(\text{In}+\text{Zn})$

The following ranges are further preferable.

$0.35 \leq \text{In}/(\text{In}+\text{Ga}+\text{Zn}) \leq 0.60$ $0.15 \leq \text{Ga}/(\text{In}+\text{Ga}+\text{Zn}) \leq 0.45$ $0.10 \leq \text{Zn}/(\text{In}+\text{Ga}+\text{Zn}) \leq 0.45$ Further, it can be divided into the region 1 and the region 2.

$\text{In}/(\text{In}+\text{Ga}) < 0.60$      Region 1

$0.60 \leq \text{In}/(\text{In}+\text{Ga})$      Region 2

It is particularly preferred that the region 1 be in the following range:

$\text{Ga}/(\text{In}+\text{Ga}+\text{Zn}) \leq 0.45$ $0.10 \leq \text{Zn}/(\text{In}+\text{Ga}+\text{Zn}) \leq 0.40$ $\text{In}/(\text{In}+\text{Ga}) < 0.60$ It is particularly preferred that the region 2 be in the following range:

$\text{In}/(\text{In}+\text{Ga}+\text{Zn}) \leq 0.65$ $0.10 \leq \text{Ga}/(\text{In}+\text{Ga}+\text{Zn})$ $0.10 \leq \text{Zn}/(\text{In}+\text{Ga}+\text{Zn})$ $0.60 \leq \text{In}/(\text{In}+\text{Ga})$ $0.51 \leq \text{In}/(\text{In}+\text{Zn})$ If the atomic ratio of In, Ga and Zn is within the above-mentioned region 1 or 2, it is easy to allow an In-rich structure and a Ga, Zn-rich structure to be generated.

Taking into consideration expected advantages of the resulting thin film transistor, i.e. a small photoelectric current, improved chemicals resistance, unlikeliness to be normally-on or the like, the region 1 is preferable.

In addition, as for the region 1, if the atomic ratio of In, Ga and Zn of the oxide sintered body satisfies the following formula, an increase in photocurrent and a lowering in chemicals resistance can be further suppressed, whereby restrictions imposed on the production process can be decreased.

$0.30 \leq \text{In}/(\text{In}+\text{Ga}+\text{Zn})$ $\text{Zn}/(\text{In}+\text{Ga}+\text{Zn}) \leq 0.35$ $\text{In}/(\text{In}+\text{Ga}) < 0.56$ In order to prepare a sputtering target of the region 1, it is preferable to conduct sintering at 1100° C. to 1380° C. for 1 to 100 hours. The sintering temperature is more preferably 1200° C. to 1350° C., with 1250° C. to 1320° C. being particularly preferable. If the sintering temperature is 1380° C. or higher, the bixbyite structure represented by $In_2O_3$ may be lost. Further, zinc may be evaporated to cause the composition ratio to be deviated, the specific resistance of the target may be increased, an unexpected crystal form may be generated, a large amount of energy may be required for sintering to increase the cost, or the like. If the sintering temperature is less than 1100° C., the relative density may be lowered, the specific resistance may be increased, sintering may take time to cause an increase in cost, or the like.

The heating rate (room temperature to 400° C.) is preferably 5° C./min or less, more preferably 0.2 to 3° C./min, with 0.4 to 1° C./min being particularly preferable.

Further, between 600 to 1100° C., it is particularly preferred that a holding time during which heating is stopped for 0.2 hour or more and 10 hours or less is provided, thereby to conduct heating in a stepwise manner in two or more steps, since homogeneity is increased and cracks hardly occur.

The region 2 is preferable since the amount of Ga which is a rare source can be reduced, generation of $Ga_2O_3$ which is a high-resistance material can be suppressed without restricting the specific surface area of the raw material or the like, the specific resistance of the target can be easily lowered or the like. In addition, the region 2 is preferable since advantages such as a high mobility and a small S value can be expected when a thin film transistor is formed with this region.

Further, in the region 2, if the atomic ratio of In, Ga and Zn of the oxide sintered body satisfies the following formula, an increase in photocurrent and a decrease in chemicals resistance can be relatively suppressed, whereby restrictions imposed on the structure can be decreased.

$0.20 < \text{Ga}/(\text{In}+\text{Ga}+\text{Zn})$ $\text{Zn}/(\text{In}+\text{Ga}+\text{Zn}) < 0.30$ In order to form a sputtering target of the region 2, it is preferred that sintering be conducted at 1100 to 1600° C. for 1 to 100 hours. Sintering temperature is more preferably 1200 to 1490° C., with 1300 to 1480° C. being particularly preferable. If sintering is conducted at a temperature of 1600° C. or more, Zn (zinc) may be evaporated to cause the composition ratio to be deviated, the specific resistance of the target may be increased, an unexpected crystal form may be generated, a large amount of energy may be required to cause an increase in cost or the like. If the sintering temperature is 1100° C. or less, the relative density may be decreased, the specific resistance may be increased and sintering may take time to cause an increase in cost.

The heating rate (room temperature to 400° C.) is preferably 5° C./min or less, more preferably 0.2 to 3° C./min, with 0.4 to 1° C./min being particularly preferable. The heating rate (400° C. to sintering temperature) is preferably 5° C./min or less, more preferably 0.2 to 3° C./min, with 0.4 to 1° C./min being particularly preferable.

Further, between 600 to 1100° C., it is particularly preferred that a holding time during which heating is stopped for 0.2 hour or more and 10 hours or less is provided, thereby to conduct heating in a stepwise manner in two or more steps, since homogeneity is increased and cracks hardly occur.

Within a range which does not impair the advantageous effects of the invention, the target of the invention may contain other metal elements than In, Ga and Zn, for example, Sn, Ge, Si, Ti, Zr, Hf or the like.

In the target of the invention, due to the inclusion of Sn, advantages that the resistance of the structure with a high In content can be lowered, the structure with a high In content can be easily generated, an increase in specific resistance due to generation of a lower oxide of tin or generation of a tin compound having a high resistance can be easily suppressed or the like can be expected. Therefore, it is preferred that the oxide sintered body contain Sn in the following atomic ratio.

$$0.0001 < Sn/(In+Ga+Zn+Sn) < 0.10$$

The following range is also preferable since the uniformity of the film thickness of a semiconductor layer is improved when a back channel etch thin film transistor is formed.

$$0.01 < Sn/(In+Ga+Zn+Sn) < 0.05$$

It is more preferred that the following formula be satisfied.

$$0.015 \leq Sn/(In+Ga+Zn+Sn) \leq 0.045$$

It is particularly preferred that the following formula be satisfied.

$$0.02 \leq Sn/(In+Ga+Zn+Sn) \leq 0.04$$

It is preferred that the target of the invention essentially consist of In, Ga, Zn and O, or In, Ga, Zn, Sn and O.

The "essentially consist of" the above-mentioned elements means that no other elements are contained than impurities which are inevitably mixed in during the production process. Specifically, the concentration of the elements other than the above-mentioned elements is less than 10 ppm.

If the target of the invention essentially consists of the above-mentioned elements, the number of elements to be controlled during production can be decreased, whereby control can be conducted easily.

The relative density of the sintered body constituting the target of the invention is preferably 95% or more, more preferably 96% or more, particularly preferably 97% or more. If the relative density is less than 95%, the target may be broken easily or abnormal discharge may occur easily. The relative density is a density which is relatively calculated from the theoretical density which is calculated from the weighted average. The density calculated from the weighted average of the density of each material is a theoretical density, which is taken as 100%.

The specific resistance is preferably 0.01 mΩcm or more and 20 mΩcm or less, more preferably 0.1 mΩcm or more and 10 mΩcm or less, and particularly preferably 0.2 mΩcm or more and 5 mΩcm or less. If the specific resistance exceeds 20 mΩcm, spark may occur due to abnormal discharge when DC sputtering is conducted for a long period of time. As a result, the target may be cracked or particles which have been jumped out from the target by spark may adhere to the substrate for film formation, causing performance as the oxide semiconductor film to be lowered. If the resistance is smaller than 0.01 mΩcm, the resistance of the target becomes smaller than the resistance of particles, and abnormal discharge may occur due to the particles which have been scattered.

The method for producing the sputtering target of the invention (hereinafter referred to as the target production method of the invention) is preferably a method in which a shaped body is prepared by using as a raw material oxide powder which contains In as a main component and oxide powder which contains Ga and Zn as main components, and the shaped body is then sintered.

By the above-mentioned method, a target composed of a structure having a large In content and a structure having large Ga and Zn contents can be easily obtained.

For example, by sintering a shaped body having a spinel structure represented by $ZnGa_2O_4$, it is possible to obtain the target of the invention having a bixbyite structure represented by $In_2O_3$ and a spinel structure represented by $ZnGa_2O_4$.

For example, from oxide powder having a spinel structure represented by $ZnGa_2O_4$ and oxide powder having a bixbyite structure represented by $In_2O_3$, a shaped body having an oxide having a spinel structure represented by $ZnGa_2O_4$ and an oxide having a bixbyite structure represented by $In_2O_3$ is prepared, and the shaped body is then sintered. This method has an advantage that an oxide having a structure other than a bixbyite structure represented by $In_2O_3$ and a spinel structure represented by $ZnGa_2O_4$ is hardly generated, and an oxide sintered body having a bixbyite structure represented by $In_2O_3$ and a spinel structure represented by $ZnGa_2O_4$ can be formed stably.

An oxide having a spinel structure represented by $ZnGa_2O_4$ as a raw material can be produced by the following method, for example.

ZnO powder and $Ga_2O_3$ powder are mixed such that the atomic ratio of Zn and Ga becomes 1:2, the mixture is then fired, whereby powder having a spinel structure represented by $ZnGa_2O_4$ is produced. Similarly, ZnO powder and $Ga_2O_3$ powder are mixed such that the atomic ratio of Zn and Ga becomes 1:2. The mixture is then pre-fired, followed by pulverizing.

<Explanation of Each Step in Production of a Target>
(1) Mixing Step

A mixing step is a step for mixing metal oxides which is a raw material of a sputtering target.

As the raw material, powders such as powder of an indium compound, powder of a gallium compound and powder of a zinc compound are used. As the compound of indium, indium oxide, indium hydroxide or the like can be given, for example. As the compound of gallium, gallium oxide, gallium hydroxide or the like can be given, for example. As the compound of zinc, zinc oxide and zinc hydroxide or the like can be given, for example. As for each compound, in view of advantages that sintering can be conducted easily and bi-products are unlikely to remain, an oxide is preferable.

Further, the purity of the raw material is normally 2N (99 mass %), preferably 3N (99.9 mass %) or more, and particularly preferably 4N (99.99 mass %) or more. If the purity is lower than 2N, the durability may be lowered, or, when used in a liquid crystal display, burn-in may occur due to entering of impurities to the liquid crystal.

It is preferred that metal zinc (zinc powder) be used as part of the raw material. By using zinc powder as part of the raw material, generation of white spots can be suppressed.

It is preferred that raw materials such as metal oxides used for the production of a target be mixed and be uniformly mixed and pulverized by means of a common pulverizer, e.g. a wet ball mill, a bead mill or an ultrasonic apparatus.

When a wet ball mill is used, the time for mixing and pulverizing is normally 0.5 to 60 hours, preferably 6 to 48 hours, and more preferably 8 to 36 hours. If the time for mixing and pulverizing is shorter than 0.5 hour, inferior appearance such as white spots and black spots due to insufficient dispersion of the raw material may occur. If the time for mixing and pulverizing exceeds 60 hours, an unexpected crystal form may occur since raw materials react during the mixing.

The specific surface area (BET specific surface area) of indium oxide, gallium oxide and zinc oxide is normally 3 to 18 $m^2/g$, 3 to 18 $m^2/g$ and 3 to 18 $m^2/g$, respectively, preferably 7 to 16 $m^2/g$, 7 to 16 $m^2/g$ and 3 to 10 $m^2/g$, respectively, more preferably 7 to 15 $m^2/g$, 7 to 15 $m^2/g$ and 4 to 10 $m^2/g$, and particularly preferably 11 to 15 $m^2/g$, 11 to 15 $m^2/g$ and 4 to 5 $m^2/g$. If the specific surface area is too small, an aggregate of each element may grow within the sintered body, the crystal form of the raw material powder may remain, an unexpected crystal form may be generated to cause the properties to change, or the like. If the specific surface area is too large, an unexpected crystal form may be generated to cause the properties to change and insufficient dispersion may occur to cause poor appearance or un-uniformity in properties. The specific surface area (BET specific surface area) of each metal compound which is the raw material of the target can be measured by the method specified in JIS Z 8830.

(2) Pre-Firing Step

A pre-firing step is a step optionally provided in which a mixture of the compounds as the raw material of a sputtering target is pre-fired.

By the pre-firing step, although the density of the oxide can be easily increased, the production cost may also be increased. Therefore, it is more preferred that the density be increased without conducting pre-firing.

In the pre-firing step, it is preferred that the above-mentioned mixture be heat-treated at 500 to 1200° C. for 1 to 100 hours. If a heat treatment is conducted at less than 500° C. or for shorter than 1 hour, thermal decomposition of an indium compound, a zinc compound or a tin compound may be insufficient. If the heat treatment is conducted at a temperature higher than 1200° C. or for longer than 100 hours, coarsening of particles may occur.

Therefore, it is particularly preferred that a heat treatment (pre-firing) be conducted at a temperature range of 800 to 1200° C. for 2 to 50 hours.

It is preferred that a pre-fired product obtained in this step be pulverized before the following shaping and firing steps.

(3) Shaping Step

A shaping step is a step in which the mixture obtained in the above-mentioned mixing step (the pre-fired product, if the above-mentioned pre-firing step is provided) is shaped under pressure, thereby to obtain a shaped product. By this step, the mixture or the pre-fired product is shaped into a desired shape of a product (for example, a shape which is suited for a target). If the pre-firing step is provided, after granulating fine powder of the resulting pre-fired product, the granulated product can be press-shaped into a desired shape.

As for the shaping, die shaping, cast shaping, inject shaping or the like can be mentioned, for example. In order to obtain a homogenous sintered body (target) having a high sintered density and a small specific resistance, it is preferable to conduct shaping by cold isostatic pressing (CIP), hot isostatic pressing (HIP) or the like. If shaping is conducted simply by press shaping (uniaxial pressing), unevenness in pressure may occur, whereby an unexpected crystal form may be generated.

Further, after press shaping (uniaxial pressing), it is preferable to conduct cold isostatic pressing (CIP), hot isostatic pressing (HIP) or the like, i.e. to provide two or more steps of shaping, since reproducibility is enhanced.

When CIP (cold isostatic pressing or hydrostatic pressure apparatus) is used, it is preferable to hold at a surface pressure of 800 to 3000 kgf/cm$^2$ for 0.5 to 20 minutes. Further, if the surface pressure is 800 kgf/cm$^2$ or less, the density after sintering may not be increased or the resistance may be increased. If the surface pressure is 3000 kgf/cm$^2$ or more, the apparatus may become too large to cause an economical disadvantage. If the holding time is 0.5 minute or less, the density after sintering may not be increased or the resistance may become high. A holding time of 20 minutes or more may be economically disadvantageous since a too long period of time is taken.

In the shaping, a shaping aid such as polyvinyl alcohol, methyl cellulose, polywax, oleic acid or the like may be used.

The thickness of the shaped product is normally 6 mm or more, preferably 8 mm or more, and particularly preferably 10 mm or more. If the thickness of the shaped body is less than 6 mm, the shaped body is shrunk during sintering time and becomes too thin. As a result, unevenness in thermal conductivity may occur, whereby an unexpected crystal form may be generated and the crystal diameter may become too large.

(4) Sintering Step

A sintering step is a step in which a shaped body obtained in the above-mentioned shaping step is fired.

As for the sintering conditions, it is preferred that sintering be conducted in an oxygen gas atmosphere or under an oxygen gas pressure. In the invention, the "oxygen gas atmosphere" is an atmosphere which contains 50% or more of oxygen. The "under an oxygen gas pressure" means that, in an atmosphere which contains an oxygen gas in an amount of 90% or more (preferable 98% or more), pressurizing is conducted preferably at 1 to 5 atmospheric pressures, further preferably 2 to 4 atmospheric pressures. If sintering is conducted in an atmosphere which does not contain a sufficient amount of oxygen, sublimation of ZnO or the like may occur. Further, a state in which oxidation is insufficient occurs, the density of the resulting target cannot be increased sufficiently, whereby occurrence of abnormal discharge during sputtering may not be fully suppressed.

Although it suffices that sintering be conducted under the above-mentioned conditions according to the crystal structure of an intended sintered body, sintering is normally conducted at 1100° to 1600° C. for one to 100 hours. The sintering temperature is more preferably 1200 to 1490° C., and particularly preferably 1300 to 1480° C. If sintering is conducted at 1600° C. or higher, Zn (zinc) may be evaporated to cause the composition ratio to be deviated, the target may have a high specific resistance, an unexpected crystal form may be generated, a large amount of energy for sintering may be required to cause the production cost to be increased or the like. If the sintering is conducted at 1100° C. or lower, the relative density may be lowered, the specific resistance may be increased, sintering may take time to cause the production cost to be increased or the like.

The temperature-lowering rate (cooling rate) during firing is normally 4° C./min or less, preferably 2° C./min or less, more preferably 1° C./min or less, further preferably 0.8° C./min or less, and particularly preferably 0.5° C./min or less.

If the cooling rate is 4° C./min or less, the crystal form of the invention can be easily obtained. Further, cracks hardly occur during the cooling.

In addition, heating may be temporarily stopped during heating and holding is conducted at a holding temperature, whereby sintering is conducted in two or more steps.

(5) Reduction Step

A reduction step is a step which is optionally provided according to need in order to decrease the bulk resistance of the sintered product obtained in the above-mentioned firing step in the entire target.

As for the reduction method which can be applied in this step, reduction using a reductive gas, reduction by vacuum firing, reduction with an inert gas or the like can be given.

In the case of a reduction treatment with a reductive gas, hydrogen, methane, carbon monoxide or a mixed gas with these gases and oxygen or the like can be used.

In the case of a reduction treatment by firing in an inert gas, nitrogen, argon, or a mixed gas with these gases and oxygen or the like can be used.

In the invention, it is preferred that a reduction treatment (a heat treatment in an atmosphere of an inert gas such as argon and nitrogen, a hydrogen atmosphere or under vacuum or at a low pressure) be not conducted. If a reduction treatment is conducted, a difference in resistance value in a surface part and a deep part may be generated or amplified.

Since the target of the invention can have a low specific resistance without conducting a reduction treatment, normally no reduction treatment is required.

(6) Processing Step

Processing is a step which is optionally provided according to need in order to cut the above-mentioned oxide sintered body into a shape which is suitable for mounting on a sputtering apparatus, as well as to provide a mounting jig such as a backing plate.

The thickness of a sintered body before grinding is preferably 5.5 mm or more, more preferably 6 mm or more, and particularly preferably 8 mm or more. The grinding is conducted normally by 0.2 mm or more, preferably 0.5 mm or more, and further preferably 2 mm or more for one surface. There is an advantage that a uniform target may be prepared by forming a thick sintered body, followed by sufficient grinding.

In order to form an oxide sintered body to be a sputtering target, the sintered body is ground by means of a plane grinder to allow the surface roughness Ra to be 5 µm or less. Further, the sputtering surface of the target may be subjected to mirror finishing, thereby allowing the average surface roughness thereof. Ra to be 1000 Å or less. For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods. The thickness of the target is normally 2 to 20 mm, preferably 3 to 12 mm and particularly preferably 4 to 6 mm. It is preferable to finish the surface by means of a #200 to #10,000 diamond wheel, particularly preferably by means of a #400 to #5,000 diamond wheel. If a diamond wheel with a mesh size of smaller than #200 or a diamond wheel with a mesh size of larger than #10,000 is used, the target may be broken easily. It is preferred that the surface roughness Ra of the target be 0.5 µm or less and that the grinding surface has no directivity. If Ra is larger than 0.5 µm or the grinding surface has directivity, abnormal discharge may occur or particles may be generated.

A sputtering target is obtained by bonding a target material to a backing plate. A plurality of target materials may be provided in a single backing plate to use as a substantially a single target.

Next, for cleaning, air blowing, washing with running water or the like can be used. When foreign matters are removed by air blowing, foreign matters can be removed more effectively by air intake by means of a dust collector from the side opposite to the air blow nozzle. Since the above-mentioned air blow or washing with running water has its limit, ultrasonic cleaning or the like can also be conducted. In ultrasonic cleaning, it is effective to conduct multiplex oscillation within a frequency range of 25 to 300 kHz. For example, it is preferable to perform ultrasonic cleaning every 25 kHz in a frequency range of 25 to 300 kHz by subjecting 12 kinds of frequency to multiplex oscillation.

An oxide semiconductor film formed by using the target of the invention is effective as a semiconductor layer (channel layer) of a thin film transistor. The resulting thin film transistor has excellent TFT properties such as a high mobility, a small S value and a small photocurrent.

The method for producing a semiconductor device of the invention is characterized in that it comprises the step of forming an oxide film by using the sputtering target of the invention.

An oxide film formed by using the target of the invention has a high hall mobility and has a carrier density suitable for use as a semiconductor.

A semiconductor device produced by the production method of the invention is particularly useful as a thin film transistor.

EXAMPLES

Example 1

(1) Production of a Target

A target was produced under the following conditions:
(a) Raw Material
$In_2O_3$ Purity 4N, manufactured by Nippon Rare Metal
$Ga_2O_3$ Purity 4N, manufactured by Nippon Rare Metal
ZnO Purity 4N, manufactured by Kojundo Chemical Laboratory Co., Ltd.
(b) Mixing: Raw materials were mixed for 24 hours by means of a ball mill.
(c) Granulation: Natural Drying
(d) Shaping:
Press shaping, surface pressure 400 $kgf/cm^2$, holding for 1 minute
CIP (hydrostatic pressing apparatus), surface pressure 2000 $kgf/cm^2$, holding for 1 minute
(e) Sintering: Electric Furnace
Heating rate: 1° C./min
Sintering temperature: 1400° C.
Sintering time: 20 hours
Sintering atmosphere: Air
(f) Post-treatment: No heat treatment was conducted under reduction conditions.
(g) Processing: A sintering body with a thickness of 6 mm was ground and polished to have a thickness of 5 mm.

The upper and lower surfaces and the lateral edges were cut by means of a diamond cutter. The surface was ground by a plane grinder, whereby a target material having a surface roughness Ra of 5 µm or less was obtained.

(h) The surface of the resulting sintered body for a target was subjected to air blowing, followed by ultrasonic cleaning for 3 minutes. Thereafter, the sintered body was bonded to an oxygen-free copper backing plate by means of indium solder, whereby a target was produced. The target had a surface roughness Ra of 0.5 µm or less, and had a grinding surface having no directivity.

(2) Evaluation of a Sintered Body for a Target

The resulting sintered body for a target was evaluated by the following methods.
(a) Element Composition Ratio (Atomic Ratio)
Measured by an inductively coupled plasma atomic emission spectrometer (ICP-AES).
(b) Specific Resistance
Measured according to the four probe method (JIS R1637) by means of a resistivity meter (Loresta, manufactured by Mitsubishi Chemical Analytech Co., Ltd.). The average value of specific resistance values at 10 points is taken as the specific resistance value.

(c) Relative Density (%)

Relative density was measured by the following formula based on the theoretical density calculated from the density of the raw material powder and the density of the sintered body measured by the Archimedian method.

Relative density=(Density measured by the Archimedian method)/(Theoretical density)×100(%)

(d) X-ray Diffraction Measurement (XRD)

The surface of the sintered oxide body for a target was directly measured under the following conditions, thereby to determine a crystal form.
Apparatus: "Ultima-III" manufactured by Rigaku Corporation
X-rays: Cu-Kα radiation (wavelength: 1.5406 Å, monochromatized using a graphite monochrometor)
2θ-θ reflection method, continuous scan (1.0°/min)
Sampling interval: 0.02°
Slit DS, SS: ⅔°, RS: 0.6 mm (e) Electron Probe Microanalyzer (Measurement by EPMA)

The surface portion of the target was cut out, and measured under the following conditions:
Apparatus: JEOL Ltd.
JXA-8200
Measurement Conditions
Accelerated voltage: 15 kV
Irradiation current: 50 nA
Irradiation time (per point): 50 mS (f) Appearance (Unevenness in Color)

Under daylight from a north window, a sintered body was visually observed from a place 50 cm away from it. The appearance of the sintered body was classified as follows:
A: Almost no unevenness in color
B: Slightly uneven in color
C: Uneven in color If the sintered body has unevenness in color, when a target formed of the sintered body is used, for example, it may be difficult to judge the state of the target.

An observation by means of an EPMA revealed that the target had a continuous structure of the In-rich structure with a length of 15 μm or more.

Further, the amount of oxygen deficiency was calculated by measuring by infrared absorption spectroscopy the amount of carbon dioxide generated when heated in carbon powder. The amount of oxygen deficiency was $8 \times 10^{-3}$.

The lattice constant "a" of the bixbyite structure of $In_2O_3$ obtained by XRD was 10.074.

Figure 8:
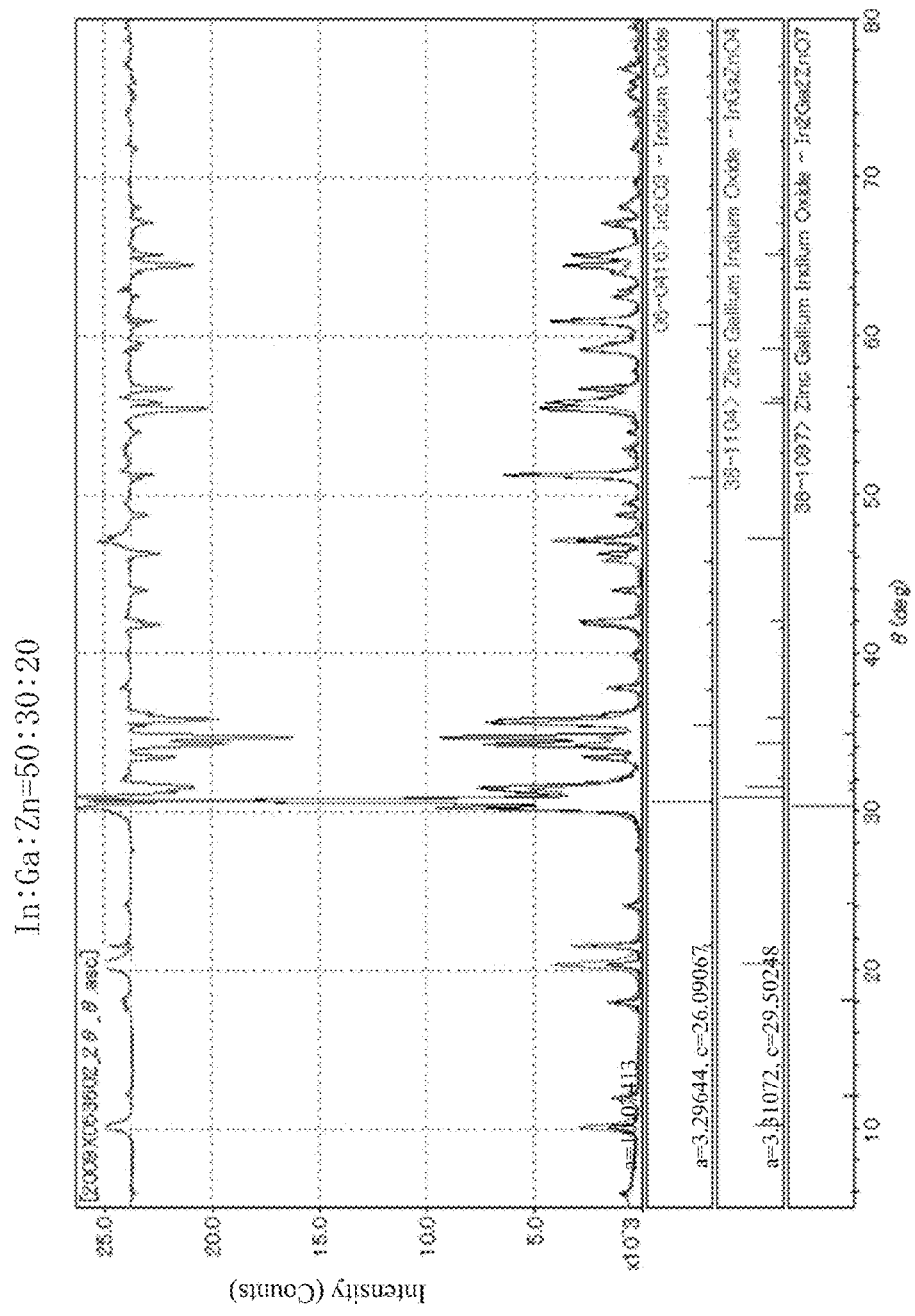
FIG. 8 is a chart obtained by an X-ray diffraction measurement (CuKα rays) of the oxide sintered body obtained in Example 1.

An X-ray diffraction chart (CuKα rays) of the surface of the target obtained in Example 1 is shown in FIG. 8.

(3) Evaluation of Film Formation (A) Stability (Variation) of Film-Forming Speed The film-forming speed before and after 1000-hour continuous discharge (film formation) was compared.

A variation of less than 5% was evaluated as A, a variation of 5% or more and less than 10% was evaluated as B and a variation of 10% or more was evaluated as C.

The film-forming speed (sputter rate) was obtained by dividing the film thickness measured by means of a stylus-type contour measuring machine (ET3000, manufactured by Kosaka Laboratory Ltd.) by the film-forming time.

(B) Film-Forming Properties of the Target (a) Abnormal Discharge

The number of times of abnormal discharge occurred during the 96-hour continuous film-formation was measured.

Less than 5 times of abnormal discharge was evaluated as A, 5 times or more and less than 20 times of abnormal discharge was evaluated as B and 20 times or more of abnormal discharge was evaluated as C.

(b) Nodule (Nodule Occurrence Density)

Evaluation was conducted as follows.

From a photograph of a sputtering target after 96-hour continuous film-formation, the area of a part covered by nodules was measured, and the nodule occurrence density was calculated by the following formula:

Nodule occurrence density=nodule occurrence area/sputtering target area

As a result, in the ascending order starting from the small amount of nodules, evaluation was made in three stages:
$10^{-2}$ or less: A, $10^{-1}$ or less: B, exceeding $10^{-1}$: C (c) Comparison in Composition Ratio Between a Target and a Thin Film By using a thin film obtained by sputtering, a difference in composition ratio between a target and a thin film was evaluated. The composition ratio of the thin film was obtained by analyzing by the ICP analysis method. The composition ratio of the target and that of the thin film were almost similar (the composition ratio of each element in the thin film was within ±2% of the composition ratio of each element in the target).

(4) Preparation of a TFT

Figure 1:
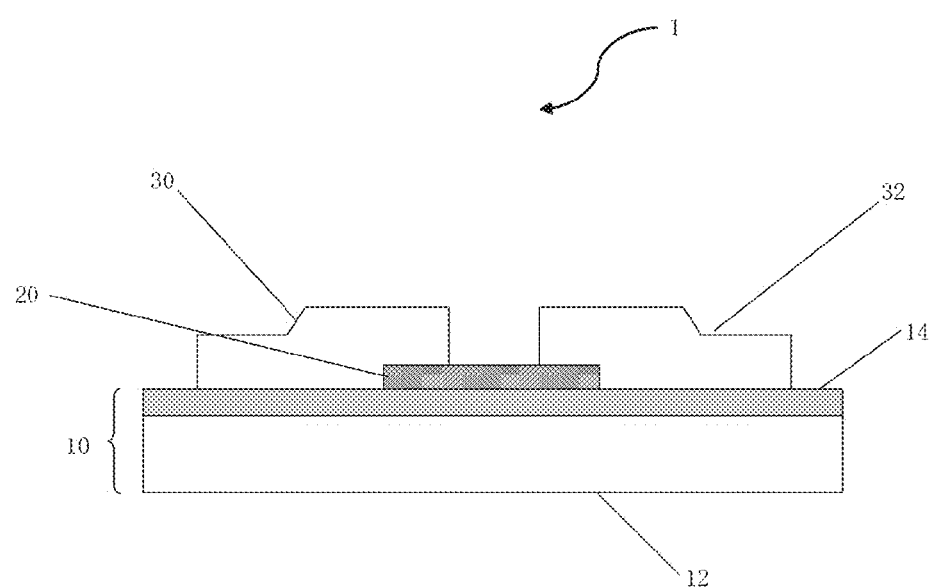
FIG. 1 is a schematic view showing the configuration of a channel stopper thin film transistor prepared by using the target obtained in Example 1.

Using the sputtering target thus obtained, a channel stopper thin film transistor 1 shown in FIG. 1 was prepared and evaluated.

As the substrate, a silicon substrate 10 provided with a thermally oxidized film was used. The silicon substrate was used as a gate electrode 12 and the thermally oxidized film (100 nm) was used as a gate insulating film 14.

Subsequently, by the RF sputtering method, film formation was conducted by using the target prepared in (1) above, and the formed film was subjected to wet etching to obtain a 25 nm-thick semiconductor film (channel layer) 20. Thereafter, a heat treatment was conducted in the air at 300° C. for 60 minutes.

In this example, input RF power was 200W. The atmosphere during film formation was 0.5 Pa (total pressure), and the gas flow ratio at this time was $Ar:O_2=97:3$. The substrate temperature was 50° C.

A 5 nm-thick Mo film, a 50 nm-thick Al film and a 5 nm-thick Mo film were sequentially stacked, and a source electrode 30 and a drain electrode 32 were formed by the photolithographic method (lift-off method).

Thereafter, a heat treatment was conducted in the atmosphere at 300° C. for 60 minutes, whereby a channel stopper thin film transistor 1 with a channel length of 40 μm and a channel width of 40 μm was fabricated.

(5) Evaluation of a TFT

The thin film transistor was evaluated as follows.

(a) Mobility (Field Effect Mobility (μ)) and S Value (V/Decade)

Mobility and S value were measured by means of a semiconductor parameter analyzer (4200, manufactured by Keithley Instruments, Inc.) at room temperature in a light-shielded environment.

(b) Evaluation of Photocurrent

A photocurrent under a light-irradiated environment and a photocurrent under a light-shielded environment were compared. Evaluation was conducted in two stages; i.e. a thin film transistor which suffered a variation in threshold voltage (Vth) of within 2V was evaluated as A and a thin film transistor which suffered a variation in threshold voltage (Vth) of exceeding 2V was evaluated as B.

The production conditions of the target and the TFT, and evaluation results are shown in Table 1-1.

Examples 2 to 9 and Comparative Examples 1 to 4

Targets and TFTs were prepared in the same manner as in Example 1, except that the composition and the condition were changed to those shown in Table 1-1 or Table 1-2. The results are shown in Table 1-1 and Table 1-2.

Example 10

ZnO powder and $Ga_2O_3$ powder were mixed such that the atomic ratio of Zn and Ga became 1:2. The mixture was then pre-fired and pulverized. A shaped body was formed by using these ZnO raw material powder and $In_2O_3$ raw material powder. The shaped body contained a crystal form represented by $ZnGa_2O_4$ (confirmed by X-ray diffraction). Targets and TFTs were produced and evaluated in the same manner as in Example 1, except that the composition and the conditions were changed to those shown in Table 1-1. The results are shown in Table 1-1.

Figure 9:
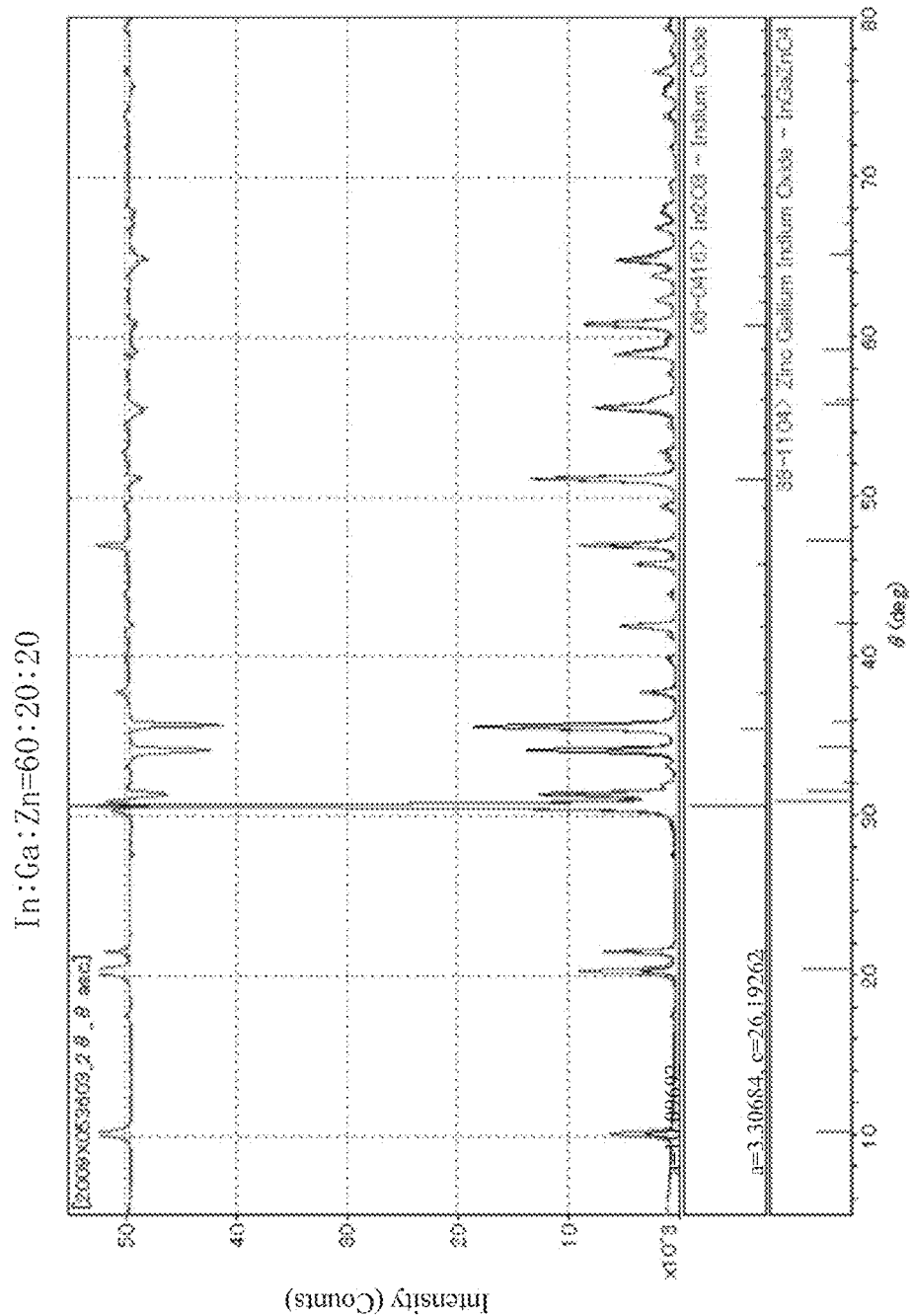
FIG. 9 is a chart obtained by an X-ray diffraction measurement (CuKα rays) of the oxide sintered body obtained in Example 2.
Figure 10:
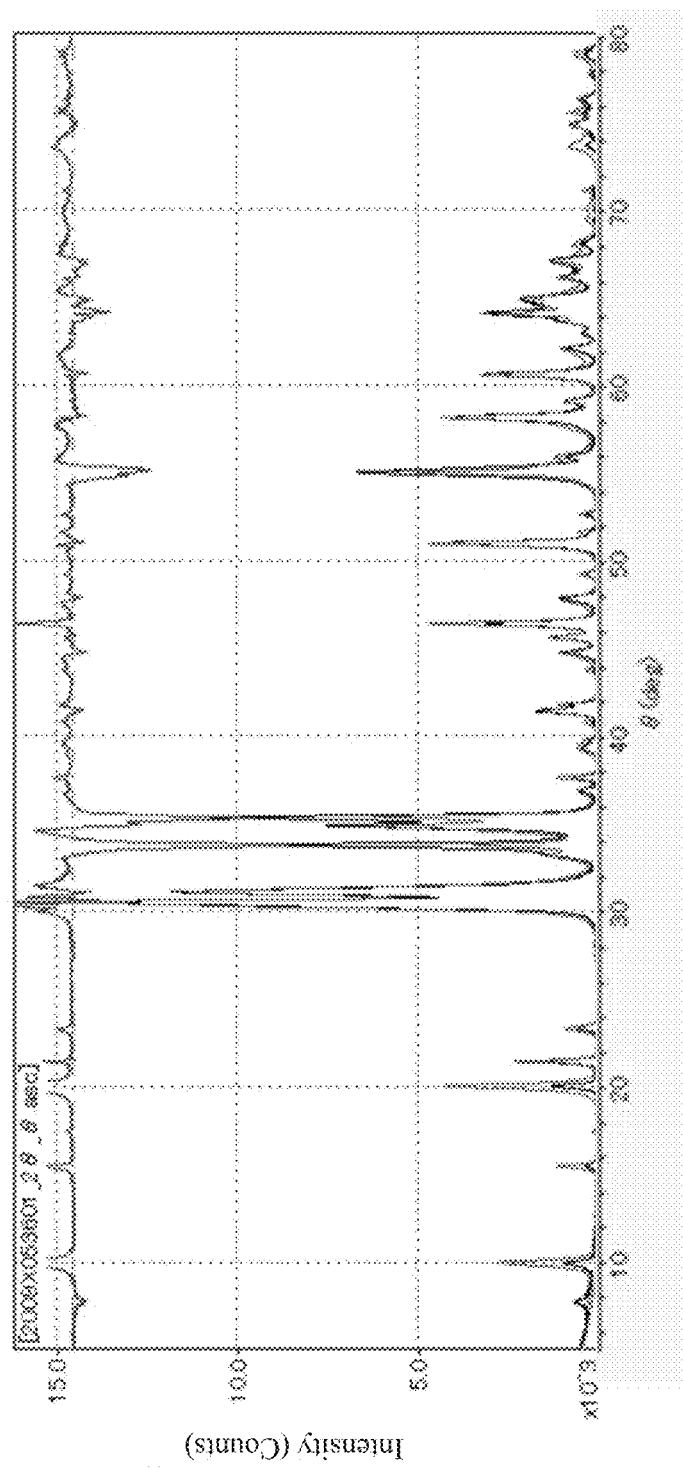
FIG. 10 is a chart obtained by an X-ray diffraction measurement (CuKα rays) of the oxide sintered body obtained in Example 3.
Figure 11:
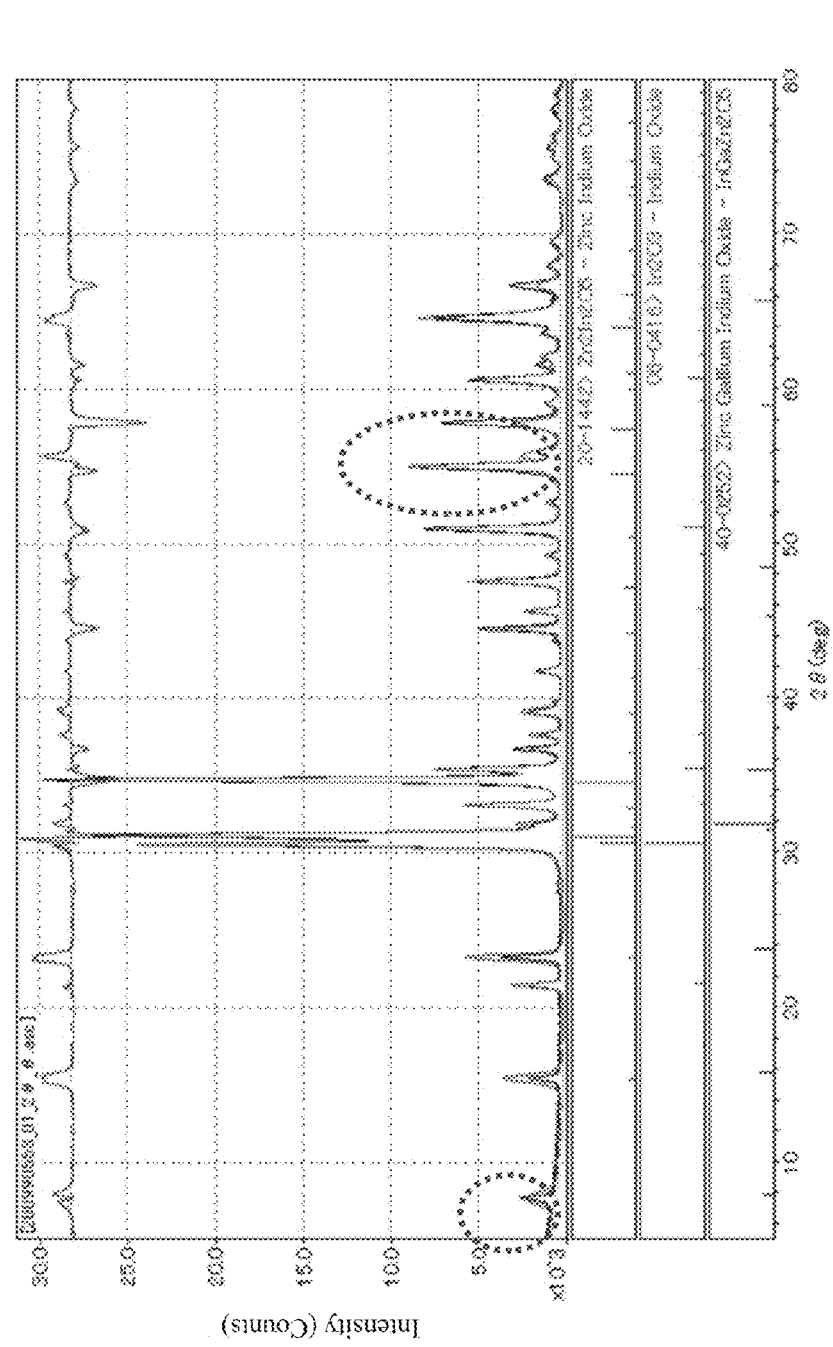
FIG. 11 is a chart obtained by an X-ray diffraction measurement (CuKα rays) of the oxide sintered body obtained in Example 6.

Charts obtained by subjecting the surface of the targets obtained in Examples 2, 3 and 6 to X-ray diffraction (Cukα rays) are shown in FIGS. 9 to 11.

Figure 12:
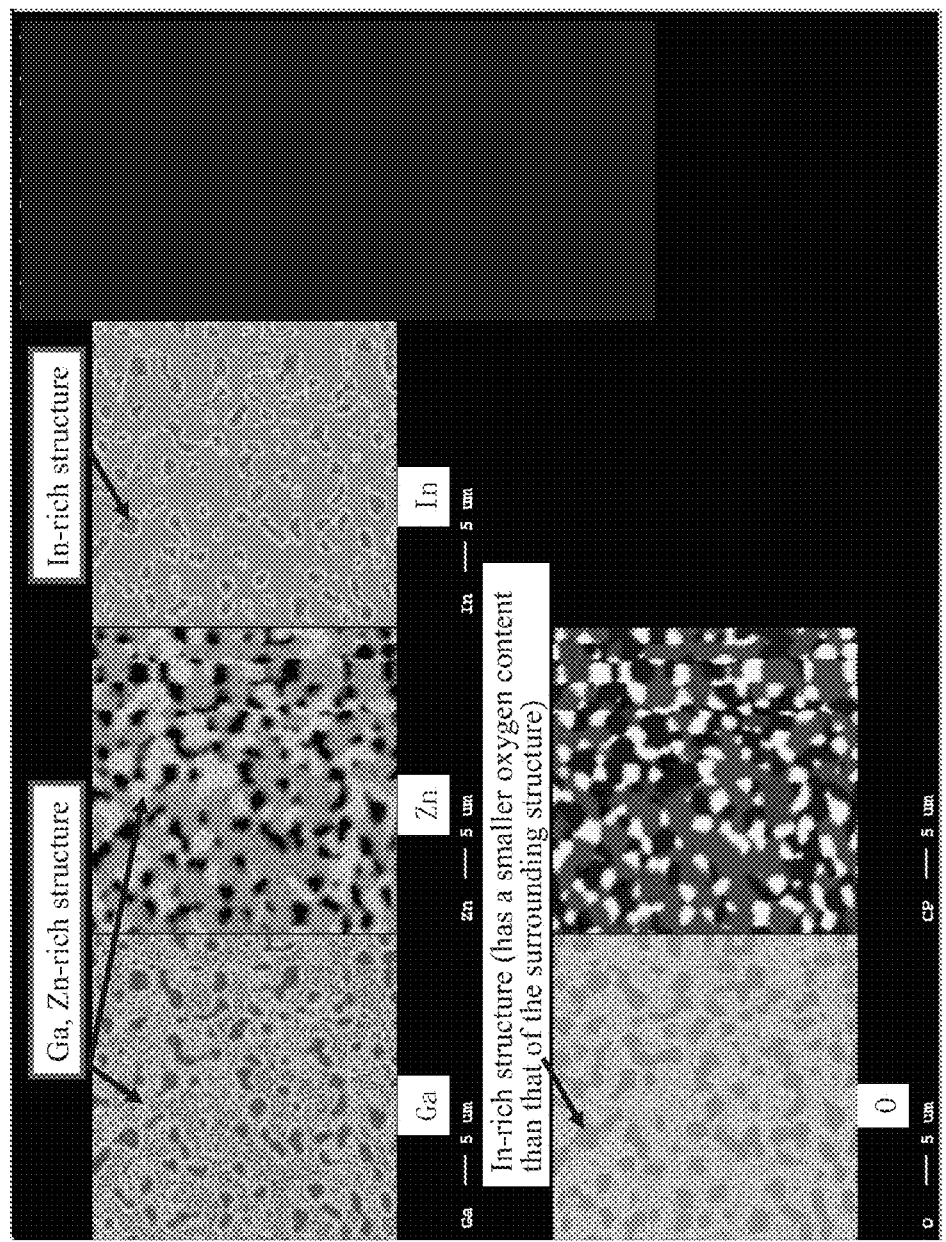
FIG. 12 is a microscopic photograph taken by an EPMA showing a dispersion map of In, Ga, Zn and O in the oxide sintered body prepared in Example 1.
Figure 13:
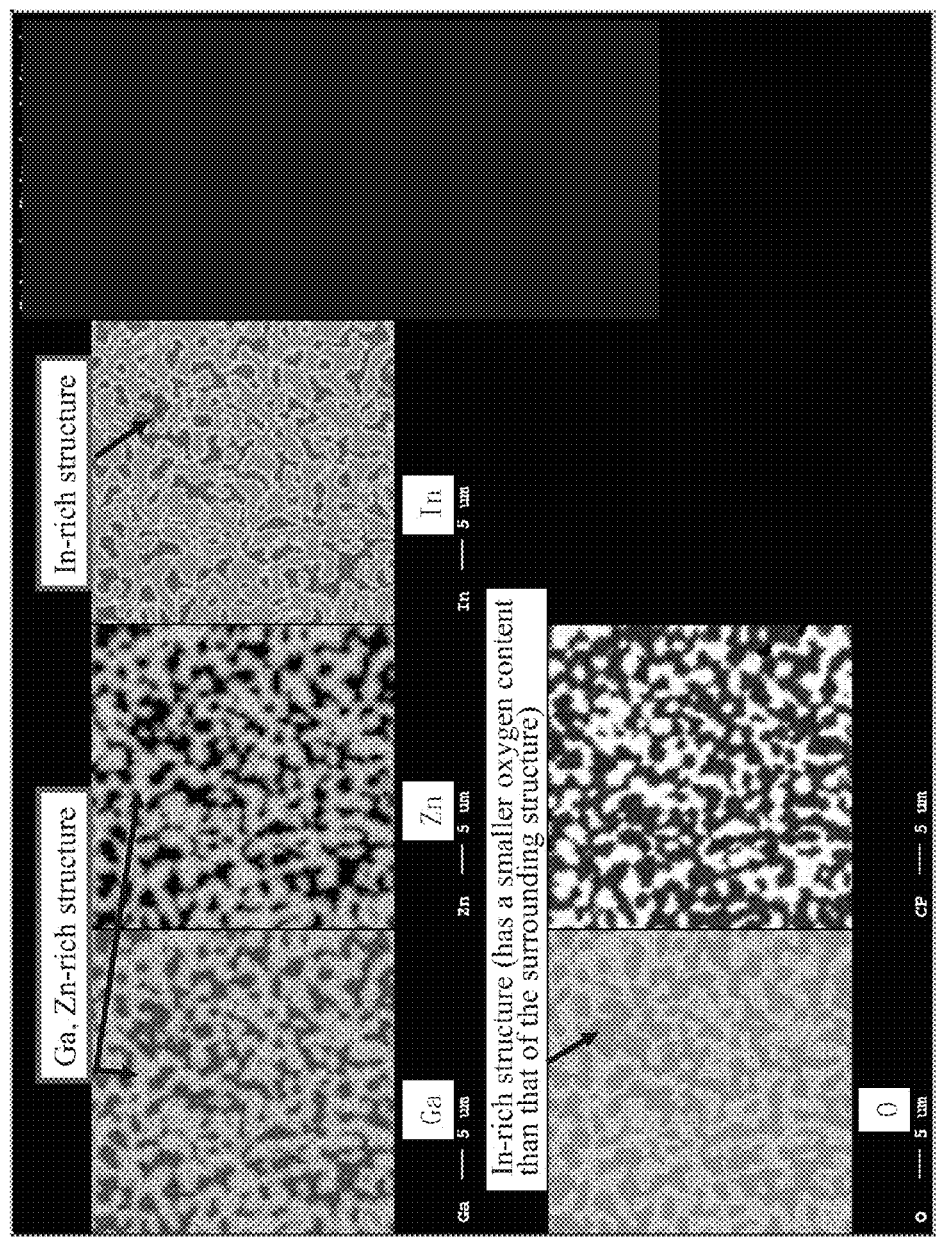
FIG. 13 is a microscopic photograph taken by an EPMA showing a dispersion map of In, Ga, Zn and O in the oxide sintered body prepared in Example 2.

Microscopic photographs of the dispersion map taken by means of an EPMA of In, Ga, Zn and O of the sintered oxide body prepared in Example 1 and 2 are shown in FIG. 12 and FIG. 13. Microscopic photographs taken by means of an EPMA of the oxide sintered body prepared in Example 4 was shown in FIGS. 2 to 5.

The correspondence between the crystal form in the X-ray diffraction in Table 1-1 and Table 1-2 and the JCPDS card No. is shown in Table 2. The "–" in Table 1-1 and Table 1-2 in the X-ray diffraction means that no XRD pattern was observed.

TABLE 1-1

| | | | Examples | | | | |
|---|---|---|---|---|---|---|---|
| | | | 1 | 2 | 3 | 4 | 5 |
| Target production | Mixing | Mixing method | Ball mill | Ball mill | Ball mill | Ball mill | Ball mill |
| | | Mixing time (hour) | 24 | 24 | 24 | 24 | 24 |
| | Granulating | Granulation method | Natural drying | Natural drying | Natural drying | Spray dryer | Natural drying |
| | Shaping | Shaping method | After press shaping CIP | After press shaping CIP | After press shaping CIP | After press shaping CIP | After press shaping CIP |
| | Sintering | Sintering atmosphere | Atmosphere | Oxygen | Oxygen | Oxygen | Atmosphere |
| | | Heating rate (Room temperature to 400° C.) (° C./min) | 1.0 | 1.0 | 1.0 | 0.5 | 1.0 |
| | | Heating rate (400° C. to holding temperature) (° C./min) | 2.5 | 1.0 | 1.0 | 0.9 | 2.5 |
| | | Holding temperature (° C.) | 1000 | 1000 | 1000 | 1000 | 1000 |
| | | Holding time (Hr) | 0 | 0 | 0 | 0.5 | 0 |
| | | Heating rate (holding temperature to sintering temperature) (° C./min) | 5.0 | 1.0 | 1.0 | 1.0 | 5.0 |
| | | Sintering temperature (° C.) | 1400 | 1480 | 1480 | 1300 | 1400 |
| | | Sintering time (Hr) | 20 | 6 | 6 | 20 | 20 |
| | | Atmosphere at the time of sintering (atm) | 3 | 3 | 3 | 2 | 3 |
| | | Cooling rate (sintering temperature to room temperature) (° C./min) | 0.3 | 0.3 | 0.3 | 0.3 | 0.3 |
| | Grinding | Thickness before grinding (mm) | 6.0 | 6.0 | 6.0 | 6.0 | 6.0 |
| | | Thickness after grinding (mm) | 5.0 | 5.0 | 5.0 | 5.0 | 5.0 |
| | | Depth of a part removed from the surface (mm) | 0.5 Both surfaces are ground | 0.5 Both surfaces are ground | 0.5 Both surfaces are ground | 0.5 Both surfaces are ground | 0.5 Both surfaces are ground |
| Target properties | Composition ratio (Atomic ratio) | In/(In + Ga + Zn) | 0.50 | 0.60 | 0.50 | 0.40 | 0.60 |
| | | Ga/(In + Ga + Zn) | 0.30 | 0.20 | 0.17 | 0.40 | 0.10 |
| | | Zn/(In + Ga + Zn) | 0.20 | 0.20 | 0.33 | 0.20 | 0.30 |
| | | Sn/(In + Ga + Zn + Sn) | — | — | — | — | — |
| | | In/(In + Ga) | 0.63 | 0.75 | 0.75 | 0.50 | 0.86 |
| | EPMA | In-rich structure | Present | Present | Present | Present | Present |
| | | Zn,Ga-rich structure | Present | Present | Present | Present | Present |
| | | Oxygen content of In-rich structure | Smaller than Ga,Zn-rich structure | Smaller than Ga,Zn-rich structure | Smaller than Ga,Zn-rich structure | Smaller than Ga,Zn-rich structure | Smaller than Ga,Zn-rich structure |
| | X ray diffraction | $In_2O_3$ | ○ | ○ | ○ | ○ | ○ |
| | | $ZnGa_2O_4$ | — | — | — | ○ | — |
| | | $In_2Ga_2ZnO_7$ | ○ | — | — | — | — |
| | | $InGaZnO_4$ | ○ | ○ | ○ | — | — |
| | | $InGaZn_2O_5$ | — | — | — | — | — |
| | | $In_2O_3(ZnO)_2$ | — | — | — | — | — |
| | | $In_{1.5}Ga_{0.5}Zn_2O_5$ | — | — | ○ | — | ○ |
| | | Others | — | — | — | — | — |
| Target evaluation | Specific resistance (mΩcm) | | 4 | 2 | 3 | 5 | 1 |
| | Relative density (%) | | 97 | 98 | 98 | 96 | 98 |
| | Abnormal discharge | | A | A | A | A | A |

TABLE 1-1-continued

|  |  |  | | | | | |
|---|---|---|---|---|---|---|---|
|  | Evaluation of film | Stability of film forming rate (variation) | A | A | A | A | A |
|  | Nodules |  | A | A | A | A | A |
|  | Appearance |  | A | A | A | A | A |
| TFT evaluation | Evaluation of TFT | Mobility (cm²/Vs) | 14 | 20 | 21 | 8 | 27 |
|  |  | S value (V/decade) | 0.3 | 0.3 | 0.2 | 0.5 | 0.1 |
|  |  | Photocurrent | A | B | B | A | B |

|  |  |  | Examples | | | | |
|---|---|---|---|---|---|---|---|
|  |  |  | 6 | 7 | 8 | 9 | 10 |
| Target production | Mixing | Mixing method | Ball mill | Ball mill | Ball mill | Ball mill | Ball mill |
|  |  | Mixing time (hour) | 24 | 24 | 24 | 24 | 24 |
|  | Granulating | Granulation method | Natural drying | Natural drying | Natural drying | Natural drying | Spray dryer |
|  | Shaping | Shaping method | After press shaping CIP | After press shaping CIP | After press shaping CIP | After press shaping CIP | After press shaping CIP |
|  | Sintering | Sintering atmosphere | Atmosphere | Oxygen | Oxygen | Oxygen | Oxygen |
|  |  | Heating rate (Room temperature to 400° C.) (° C./min) | 1.0 | 1.0 | 0.5 | 0.5 | 0.5 |
|  |  | Heating rate (400° C. to holding temperature) (° C./min) | 2.5 | 1.0 | 0.9 | 0.9 | 0.9 |
|  |  | Holding temperature (° C.) | 1000 | 1000 | 1000 | 1000 | 1000 |
|  |  | Holding time (Hr) | 0 | 0 | 0.5 | 0.5 | 0.5 |
|  |  | Heating rate (holding temperature to sintering temperature) (° C./min) | 5.0 | 1.0 | 1.0 | 1.0 | 1.0 |
|  |  | Sintering temperature (° C.) | 1400 | 1480 | 1300 | 1350 | 1300 |
|  |  | Sintering time (Hr) | 20 | 6 | 20 | 20 | 20 |
|  |  | Atmosphere at the time of sintering (atm) | 3 | 3 | 3 | 2 | 4 |
|  |  | Cooling rate (sintering temperature to room temperature) (° C./min) | 0.3 | 0.3 | 0.3 | 0.3 | 0.3 |
|  | Grinding | Thickness before grinding (mm) | 6.0 | 6.0 | 6.0 | 6.0 | 6.0 |
|  |  | Thickness after grinding (mm) | 5.0 | 5.0 | 5.0 | 5.0 | 5.0 |
|  |  | Depth of a part removed from the surface (mm) | 0.5 Both surfaces are ground | 0.5 Both surfaces are ground | 0.5 Both surfaces are ground | 0.5 Both surfaces are ground | 0.5 Both surfaces are ground |
| Target properties | Composition ratio (Atomic ratio) | In/(In + Ga + Zn) | 0.50 | 0.50 | 0.40 | 0.34 | 0.40 |
|  |  | Ga/(In + Ga + Zn) | 0.10 | 0.30 | 0.40 | 0.32 | 0.40 |
|  |  | Zn/(In + Ga + Zn) | 0.40 | 0.20 | 0.20 | 0.34 | 0.20 |
|  |  | Sn/(In + Ga + Zn + Sn) | — | 0.04 | 0.04 | 0.03 | — |
|  |  | In/(In + Ga) | 0.83 | 0.63 | 0.50 | 0.52 | 0.50 |
|  | EPMA | In-rich structure | Present | Present | Present | Present | Present |
|  |  | Zn,Ga-rich structure | Present | Present | Present | Present | Present |
|  |  | Oxygen content of In-rich structure | Smaller than Ga,Zn-rich structure | Smaller than Ga,Zn-rich structure | Smaller than Ga,Zn-rich structure | Smaller than Ga,Zn-rich structure | Smaller than Ga,Zn-rich structure |
|  | X ray diffraction | $In_2O_3$ | ○ | ○ | ○ | ○ | ○ |
|  |  | $ZnGa_2O_4$ | — | — | ○ | — | ○ |
|  |  | $In_2Ga_2ZnO_7$ | — | ○ | — | — | — |
|  |  | $InGaZnO_4$ | — | ○ | — | ○ | — |
|  |  | $InGaZn_2O_5$ | — | — | — | — | — |
|  |  | $In_2O_3(ZnO)_2$ | — | — | — | — | — |
|  |  | $In_{1.5}Ga_{0.5}Zn_2O_5$ | ○ | — | — | — | — |
|  |  | Others | — | — | — | — | — |
| Target evaluation | Specific resistance (mΩcm) |  | 1 | 1 | 2 | 3 | 4 |
|  | Relative density (%) |  | 98 | 99 | 98 | 96 | 97 |
|  | Abnormal discharge |  | A | A | A | A | A |
|  | Evaluation of film | Stability of film forming rate (variation) | A | A | A | A | A |
|  | Nodules |  | A | A | A | A | A |
|  | Appearance |  | A | A | A | A | A |
| TFT evaluation | Evaluation of TFT | Mobility (cm²/Vs) | 26 | 14 | 8 | 9 | 9 |
|  |  | S value (V/decade) | 0.1 | 0.3 | 0.5 | 0.4 | 0.4 |
|  |  | Photocurrent | B | B | A | A | A |

TABLE 1-2

|  |  |  | Comparative Examples | | | |
|---|---|---|---|---|---|---|
|  |  |  | 1 | 2 | 3 | 4 |
| Target production | Mixing | Mixing method | Ball mill | Ball mill | Ball mill | Ball mill |
|  |  | Mixing time (hour) | 24 | 24 | 72 | 24 |
|  | Granulating | Granulation method | Natural drying | Natural drying | Natural drying | Natural drying |

TABLE 1-2-continued

|  |  |  | Comparative Examples | | | |
|---|---|---|---|---|---|---|
|  |  |  | 1 | 2 | 3 | 4 |
| Shaping | Shaping method | | After press shaping CIP | After press shaping CIP | Only press shaping | After press shaping CIP |
| Sintering | Sintering atmosphere | | Oxygen | Oxygen | Atmosphere | Oxygen |
|  | Heating rate (Room temperature to 400° C.) (° C./min) | | 1.0 | 1.0 | 1.0 | 1.0 |
|  | Heating rate (400° C. to holding temperature) (° C./min) | | 1.0 | 1.0 | 2.5 | 1.0 |
|  | Holding temperature (° C.) | | 1000 | 1000 | 1000 | 1000 |
|  | Holding time (Hr) | | 0 | 0 | 0 | 0 |
|  | Heating rate (holding temperature to sintering temperature) (° C./min) | | 1.0 | 1.0 | 5.0 | 1.0 |
|  | Sintering temperature (° C.) | | 1480 | 1480 | 1500 | 1480 |
|  | Sintering time (Hr) | | 6 | 6 | 12 | 6 |
|  | Atmosphere at the time of sintering (atm) | | 1 | 1 | 1 | 1 |
|  | Cooling rate (sintering temperature to room temperature) (° C./min) | | 0.3 | 0.3 | Quenching | 0.3 |
| Grinding | Thickness before grinding (mm) | | 6.0 | 6.0 | 4.1 | 6.0 |
|  | Thickness after grinding (mm) | | 5.0 | 5.0 | 4.1 | 5.0 |
|  | Depth of a part removed from the surface (mm) | | 0.5 Both surfaces are ground | 0.5 Both surfaces are ground | 0.0 — | 0.5 Both surfaces are ground |
| Target properties | Composition ratio (Atomic ratio) | In/(In + Ga + Zn) | 1.00 | 0.60 | 0.42 | 0.10 |
|  |  | Ga/(In + Ga + Zn) | 0.00 | 0.40 | 0.16 | 0.60 |
|  |  | Zn/(In + Ga + Zn) | 0.00 | 0.00 | 0.42 | 0.30 |
|  |  | Sn/(In + Ga + Zn + Sn) | 0.30 | 0.00 | 0.00 | 0.00 |
|  |  | In/(In + Ga) | 1.00 | 0.60 | 0.72 | 0.14 |
|  | EPMA | In-rich structure | Present | Present | Present | None |
|  |  | Zn,Ga-rich structure | None | None | None | None |
|  |  | Oxygen content of In-rich structure | — | — | — | — |
|  | X ray diffraction | $In_2O_3$ | ○ | ○ | ○ | — |
|  |  | $ZnGa_2O_4$ | — | — | — | ○ |
|  |  | $In_2Ga_2ZnO_7$ | — | — | — | — |
|  |  | $InGaZnO_4$ | — | — | — | — |
|  |  | $InGaZn_2O_5$ | — | — | — | — |
|  |  | $In_2O_3(ZnO)_2$ | — | — | ○ | — |
|  |  | $In_{1.5}Ga_{0.5}Zn_2O_5$ | — | — | — | — |
|  |  | Others | ○ | ○ | ○ | — |
| Target evaluation | Specific resistance | | 2700 | 4200 | 30 | 8000 |
|  | Relative density (%) | | 91 | 89 | 94 | 87 |
|  | Abnormal discharge | | B | C | B | C |
| Evaluation of film formation | Stability of film forming rate (variation) | | B | B | B | B |
|  | Nodules | | C | B | A | A |
|  | Appearance | | B | C | B | B |
| TFT evaluation | Evaluation of TFT | Mobility (cm²/Vs) | Not driven | Not driven | 10 | Not driven |
|  |  | S value (V/decade) | Not driven | Not driven | 0.3 | Not driven |
|  |  | Photocurrent | Not driven | Not driven | B | Not driven |

TABLE 2

|  | Crystal form | JCPDS Card No. |
|---|---|---|
| $In_2O_3$ | | 06-0416 |
| $ZnGa_2O_4$ | | 38-1240 |
| $In_2Ga_2ZnO_7$ | | 38-1097 |
| $InGaZnO_4$ | $InGaO_3(ZnO)(m = 1)$ | 38-1104 |
| $InGaZn_2O_5$ | $InGaO_3(ZnO)_2(m = 2)$ | 40-0252 |
| $In_2O_3(ZnO)_2$ | $In_2O_3(ZnO)_3(m = 2)$ | 20-1442 |
| $In_{1.5}Ga_{0.5}Zn_2O_5$ | | Not registered |
| Others | (A peak which could not be identified) | — |

INDUSTRIAL APPLICABILITY

The sputtering target of the invention has a low specific resistance, and hence no reduction treatment is required, and as a result, production cost can be reduced.

The sputtering target of the invention is useful as a target for forming an oxide semiconductor film.

According to the invention, it is possible to provide a sputtering target having an improved film-forming property, in particular, a sputtering target for forming an oxide semiconductor film.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A sputtering target comprising an oxide sintered body which comprises In, Ga and Zn, and does not comprise Sn or comprises Sn at an atomic ratio [Sn/(In+Ga+Zn+Sn)] of less than 0.05, and comprises a structure having a larger In content than that in surrounding structures and a structure having larger Ga and Zn contents than those in surrounding structures.

2. The sputtering target according to claim 1, wherein the oxygen content in the structure having a larger In content is smaller than that in surrounding structures.

3. The sputtering target according to claim 1, wherein the structure having a larger In content has a continuous structure with a length of 15 μm or longer.

4. The sputtering target according to claim 1, wherein the oxide sintered body has a bixbyite structure represented by $In_2O_3$ and a homologous structure represented by $InGaZnO_4$.

5. The sputtering target according to claim 1, wherein the oxide sintered body comprises a bixbyite structure represented by $In_2O_3$ and a spinel structure represented by $ZnGa_2O_4$.

6. The sputtering target according to claim 1, wherein the oxide sintered body comprises a bixbyite structure represented by $In_2O_3$ and a homologous structure represented by $In_{1.5}Ga_{0.5}Zn_2O_5$.

7. The sputtering target according to claim 1, wherein the atomic ratio of In, Ga and Zn of the oxide sintered body satisfies the following formulas:

$0.20 \leq In/(In+Ga+Zn) \leq 0.70$ $0.01 \leq Ga/(In+Ga+Zn) \leq 0.50$ $0.05 \leq Zn/(In+Ga+Zn) \leq 0.60$.

8. The sputtering target according to claim 7, wherein the atomic ratio of In, Ga and Zn of the oxide sintered body satisfies the following formulas:

$Ga/(In+Ga+Zn) \leq 0.45$ $0.10 \leq Zn/(In+Ga+Zn) \leq 0.40$ $In/(In+Ga) < 0.60$.

9. The sputtering target according to claim 7, wherein the atomic ratio of In, Ga and Zn of the oxide sintered body satisfies the following formulas:

$In/(In+Ga+Zn) \leq 0.65$ $0.10 \leq Ga/(In+Ga+Zn)$ $0.10 \leq Zn/(In+Ga+Zn)$ $0.60 \leq In/(In+Ga)$ $0.51 \leq In/(In+Zn)$.

10. The sputtering target according to claim 1, wherein the oxide sintered body further comprises Sn in an atomic ratio which satisfies the following formula:

$0.0001 < Sn/(In+Ga+Zn+Sn) < 0.05$.

11. The sputtering target according to claim 1, which consists essentially of In, Ga, Zn and O.

12. A method for producing the sputtering target according to claim 5, which comprises the step of sintering a shaped body which comprises an oxide comprising a spinel structure represented by $ZnGa_2O_4$.

13. A method for producing a semiconductor device comprising the step of forming an oxide film by using the sputtering target according to claim 1.

14. The sputtering target according to claim 2, wherein the structure having a larger In content has a continuous structure with a length of 15 μm or longer.

15. The sputtering target according to claim 2, wherein the oxide sintered body has a bixbyite structure represented by $In_2O_3$ and a homologous structure represented by $InGaZnO_4$.

16. The sputtering target according to claim 2, wherein the oxide sintered body comprises a bixbyite structure represented by $In_2O_3$ and a spinel structure represented by $ZnGa_2O_4$.

17. The sputtering target according to claim 2, wherein the oxide sintered body comprises a bixbyite structure represented by $In_2O_3$ and a homologous structure represented by $In_{1.5}Ga_{0.5}Zn_2O_5$.

18. The sputtering target according to claim 2, wherein the atomic ratio of In, Ga and Zn of the oxide sintered body satisfies the following formulas:

$0.20 \leq In/(In+Ga+Zn) \leq 0.70$ $0.01 \leq Ga/(In+Ga+Zn) \leq 0.50$ $0.05 \leq Zn/(In+Ga+Zn) \leq 0.60$.

19. The sputtering target according to claim 18, wherein the atomic ratio of In, Ga and Zn of the oxide sintered body satisfies the following formulas:

$Ga/(In+Ga+Zn) \leq 0.45$ $0.10 \leq Zn/(In+Ga+Zn) \leq 0.40$ $In/(In+Ga) < 0.60$.

20. The sputtering target according to claim 18, wherein the atomic ratio of In, Ga and Zn of the oxide sintered body satisfies the following formulas:

$In/(In+Ga+Zn) \leq 0.65$ $0.10 \leq Ga/(In+Ga+Zn)$ $0.10 \leq Zn/(In+Ga+Zn)$ $0.60 \leq In/(In+Ga)$ $0.51 \leq In/(In+Zn)$.

* * * * *